(12) United States Patent
Nakamura et al.

(10) Patent No.: US 8,912,279 B2
(45) Date of Patent: Dec. 16, 2014

(54) RESIN COMPOSITION

(71) Applicant: Ajinomoto Co., Inc., Chuo-ku (JP)

(72) Inventors: Shigeo Nakamura, Kawasaki (JP); Kazuhiko Tsurui, Kawasaki (JP); Masanori Yoda, Kawasaki (JP)

(73) Assignee: Ajinomoto Co., Inc., Chuo-ku (JP)

( * ) Notice: Subject to any disclaimer, the term of this patent is extended or adjusted under 35 U.S.C. 154(b) by 0 days.

(21) Appl. No.: 14/087,113

(22) Filed: Nov. 22, 2013

(65) Prior Publication Data

US 2014/0087152 A1  Mar. 27, 2014

Related U.S. Application Data

(63) Continuation of application No. PCT/JP2012/058005, filed on Mar. 27, 2012.

(30) Foreign Application Priority Data

May 27, 2011  (JP) .................................. 2011-119400

(51) Int. Cl.
*C08G 67/02* (2006.01)
*C08K 5/5415* (2006.01)
*C09J 11/06* (2006.01)
*H05K 3/38* (2006.01)
*H01L 23/14* (2006.01)
*C08K 3/00* (2006.01)
*C08L 63/00* (2006.01)
*H05K 1/03* (2006.01)
*H01L 23/29* (2006.01)

(52) U.S. Cl.
CPC .............. *C09J 11/06* (2013.01); *C08K 5/5415* (2013.01); *H05K 1/0373* (2013.01); *H01L 23/296* (2013.01); *H01L 23/295* (2013.01); *H05K 3/381* (2013.01); *H01L 23/293* (2013.01); *H01L 23/145* (2013.01); *C08K 3/00* (2013.01); *C08L 63/00* (2013.01)
USPC ....................................................... 524/612

(58) Field of Classification Search
CPC ............................. H05K 1/0373; H05K 1/056
USPC ....................................................... 524/612
See application file for complete search history.

(56) References Cited

U.S. PATENT DOCUMENTS

| | | | | |
|---|---|---|---|---|
| 6,469,109 | B2 * | 10/2002 | Ueda et al. ................. | 525/507 |
| 2010/0044090 | A1 * | 2/2010 | Endo ........................ | 174/260 |
| 2011/0189432 | A1 | 8/2011 | Goto et al. | |
| 2011/0223383 | A1 | 9/2011 | Goto et al. | |
| 2011/0244183 | A1 | 10/2011 | Goto et al. | |

FOREIGN PATENT DOCUMENTS

| | | | |
|---|---|---|---|
| EP | 1 137 328 | | 9/2001 |
| GB | 1 337 338 | * | 6/1971 |
| JP | 11-060951 | | 3/1999 |
| JP | 2001-261776 | | 9/2001 |
| JP | 2003-012892 | | 1/2003 |
| JP | 2003-082306 | | 3/2003 |
| JP | 2004-352956 | | 12/2004 |
| JP | 2005 340270 | * | 12/2005 |
| JP | 2006-057013 | | 3/2006 |
| JP | 2006-117826 | | 5/2006 |
| JP | 2006-131749 | | 5/2006 |
| JP | 2007-273616 | | 10/2007 |
| JP | 2009-270001 | | 11/2009 |
| JP | 4674730 | | 2/2011 |
| JP | 4686750 | | 2/2011 |
| JP | 4782870 | | 7/2011 |
| TW | 200905264 | | 2/2009 |
| TW | 201041969 | | 12/2010 |
| WO | 2008/123388 | | 10/2008 |
| WO | 2008/126825 | | 10/2008 |

OTHER PUBLICATIONS

JP 11 000951 Machine translation (.*
JP 2005 340270 Machine translation (2005).*
Taiwanese Office Action mailed Dec. 26, 2013 in patent application No. 101111731.
International Search Report issued in PCT/JP2012/058005 issued Jun. 15, 2012.
Office Action issued in corresponding Korean Patent Application No. 10-2013-7033148 mailed Mar. 24, 2014.

* cited by examiner

*Primary Examiner* — Kuo-Liang Peng
(74) *Attorney, Agent, or Firm* — Oblon, Spivak, McClelland, Maier & Neustadt, L.L.P.

(57) ABSTRACT

Resin compositions which contain an epoxy resin, an alkoxy oligomer, and an inorganic filler provide insulating layers that have a surface with not only low arithmetic mean roughness but also low root mean square roughness in a wet roughening step and that are capable of forming thereon a plated conductive layer having a sufficient peel strength that can be formed while maintaining the glass transition temperature and thermal expansion coefficient.

23 Claims, No Drawings

RESIN COMPOSITION

CROSS REFERENCES TO RELATED APPLICATIONS

This application is a continuation of International Patent Application No. PCT/JP2012/058005, filed on Mar. 27, 2012, and claims priority to Japanese Patent Application No. 2011-119400, filed on May 27, 2011, both of which are incorporated herein by reference in their entireties.

BACKGROUND OF THE INVENTION

1. Field of the Invention

The present invention relates to resin compositions. The present invention further relates to adhesive films, prepregs, multilayered printed wiring boards, and semiconductor devices each of which contain such a resin composition.

2. Discussion of the Background

In recent years, downsizing and high functionalization of electronic instruments have been advanced. In multilayered printed wiring boards, a buildup layer has been made multilayered, and microfabrication and high densification of wirings have been required.

Various attempts have been made to meet the requirements. For example, JP-A-2006-117826, which is incorporated herein by reference in its entirety, discloses a resin composition containing a silicone alkoxy oligomer. It is described that an insulating material formed of such a composition may have adhesive properties. In Japanese Patent No. 4674730, Japanese Patent No. 4686750, and Japanese Patent No. 4782870, all of which are incorporated herein by reference in their entireties, general formulations have been investigated. However, the performance thereof was not always satisfactory because, for example, they require a specialized resin system.

Thus, there remains a need for improved resin compositions for use in adhesive films, prepregs, multilayered printed wiring boards, and semiconductor devices.

SUMMARY OF THE INVENTION

Accordingly, it is one object of the present invention to provide novel resin compositions.

It is another object of the present invention to provide novel resin compositions which can form an insulating layer that has a surface with not only low arithmetic mean roughness but also low root mean square roughness in a wet roughening step and that is capable of forming thereon a plated conductive layer having a sufficient peel strength while maintaining the glass transition temperature and thermal expansion coefficient.

It is another object of the present invention to provide novel adhesive films, prepregs, multilayered printed wiring boards, and semiconductor devices which are prepared from such a resin composition.

These and other objects, which will become apparent during the following detailed description, have been achieved by the inventors' discovery of a resin composition containing (A) an epoxy resin, (B) an alkoxy oligomer, and (C) an inorganic filler.

Specifically, the present invention provides the following embodiments:

(1) A resin composition comprising (A) an epoxy resin, (B) an alkoxy oligomer, and (C) an inorganic filler.

(2) The resin composition according to (1), wherein at least part of the alkoxy oligomer (B) is reacted with the inorganic filler (C) to form a reaction product.

(3) The resin composition according to (2), formed by reacting the alkoxy oligomer (B) and the inorganic filler (C) in advance and adding the resultant to the epoxy resin (A).

(4) The resin composition according to (3), formed by reacting the alkoxy oligomer (B) and the inorganic filler (C) at 50 to 150° C. for 0.5 to 3 hours in advance and adding the resultant to the epoxy resin (A).

(5) The resin composition according to any one of (2) to (4), wherein a carbon amount per unit surface area of the inorganic filler (C) is 0.05 mg/m$^2$ or more.

(6) The resin composition according to (5), wherein a value of [amount (mg) of carbon atom in the alkoxy oligomer (B) reacted with the inorganic filler (C)/surface area (m$^2$) of the inorganic filler (C)] is 0.05 mg/m$^2$ or more.

(7) The resin composition according to any one of (1) to (6), wherein a content of the alkoxy oligomer (B) is 0.1 to 5% by mass when a content of the inorganic filler (C) is defined as 100% by mass.

(8) The resin composition according to any one of (1) to (7), wherein a viscosity (25° C.) of the alkoxy oligomer (B) is 10 mm$^2$/s to 2,000 mm$^2$/s.

(9) The resin composition according to any one of (1) to (8), wherein the alkoxy oligomer (B) is one or more selected from the group consisting of a methyl group-containing alkoxysilyl resin, a phenyl group-containing alkoxysilyl resin, an epoxy group-containing alkoxysilyl resin, a mercapto group-containing alkoxysilyl resin, an amino group-containing alkoxysilyl resin, an acrylic group-containing alkoxysilyl resin, a methacrylic group-containing alkoxysilyl resin, a ureido group-containing alkoxysilyl resin, an isocyanate group-containing alkoxysilyl resin, and a vinyl group-containing alkoxysilyl resin.

(10) The resin composition according to any one of (1) to (8), wherein the alkoxy oligomer (B) is one or more selected from the group consisting of a glycidoxypropyl group-containing alkoxysilyl resin, an aminopropyl group-containing alkoxysilyl resin, an N-2-(aminoethyl)-3-aminopropyl group-containing alkoxysilyl resin, an N-phenyl-3-aminopropyl group-containing alkoxysilyl resin, a methacryloxypropyl group-containing alkoxysilyl resin, an acryloxypropyl group-containing alkoxysilyl resin, a mercaptopropyl group-containing alkoxysilyl resin, a ureidopropyl group-containing alkoxysilyl resin, and an isocyanatopropyl group-containing alkoxysilyl resin.

(11) The resin composition according to any one of (1) to (8), wherein the alkoxy oligomer (B) is one or more selected from the group consisting of a glycidoxypropyl group-containing methoxysilyl resin, an aminopropyl group-containing methoxysilyl resin, an aminopropyl group-containing ethoxysilyl resin, an N-2-(aminoethyl)-3-aminopropyl group-containing methoxysilyl resin, an N-phenyl-3-aminopropyl group-containing methoxysilyl resin, a methacryloxypropyl group-containing methoxysilyl resin, an acryloxypropyl group-containing methoxysilyl resin, a mercaptopropyl group-containing methoxysilyl resin, a ureidopropyl group-containing ethoxysilyl resin, and an isocyanatopropyl group-containing ethoxysilyl resin.

(12) The resin composition according to any one of (1) to (8), wherein the alkoxy oligomer (B) is represented by a structure of the following formula (1):

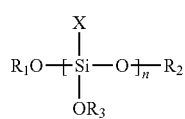

wherein $R_1$, $R_2$ and $R_3$ each independently are a linear or branched alkyl group having 1 to 10 carbon atoms; X is a lower alkyl group, a glycidoxyalkyl group, an aminoalkyl group, a mercaptoalkyl group, an acryloxyalkyl group, a methacryloxyalkyl group, a ureidoalkyl group, an isocyanatoalkyl group, or a vinylalkyl group; n is an integer of 2 to 10; a plurality of X may be the same as or different from each other; and a plurality of $R_3$ may be the same as or different from each other.

(13) The resin composition according to any one of (1) to (12), further comprising (D) an accelerator.

(14) The resin composition according to any one of (1) to (13), further comprising (E) a curing agent.

(15) The resin composition according to any one of (1) to (14), further comprising (F) a thermoplastic resin.

(16) The resin composition according to any one of (1) to (15), further comprising (G) a rubber particle.

(17) The resin composition according to any one of (1) to (16), further comprising (H) a flame retardant.

(18) The resin composition according to any one of (1) to (17), wherein when curing the resin composition to form an insulating layer, roughening a surface of the insulating layer, and plating the surface of the insulating layer to form a conductive layer, a peel strength between the insulating layer and the conductive layer is 0.4 kgf/cm to 1.0 kgf/cm, and when curing the resin composition to form an insulating layer, and roughening a surface of the insulating layer, the surface of the insulating layer after roughening has an arithmetic mean roughness of 10 nm to 300 nm and a root mean square roughness of 10 to 520 nm.

(19) An adhesive film, in which a layer of the resin composition according to any one of (1) to (18) is formed on a support.

(20) A prepreg, in which the resin composition according to any one of (1) to (18) is impregnated in a sheet-shaped reinforcing base material.

(21) A multilayered printed wiring board, in which an insulating layer is formed of a cured product of the resin composition according to any one of (1) to (18).

(22) A semiconductor device using the multilayered printed wiring board according to (21).

By using a resin composition containing (A) an epoxy resin, (B) an alkoxy oligomer, and (C) an inorganic filler, an insulating layer that has a surface with not only low arithmetic mean roughness but also low root mean square roughness in a wet roughening step and that is capable of forming thereon a plated conductive layer having a sufficient peel strength while maintaining the glass transition temperature and thermal expansion coefficient.

DETAILED DESCRIPTION OF THE PREFERRED EMBODIMENTS

The resin composition of the present invention contains (A) an epoxy resin, (B) an alkoxy oligomer, and (C) an inorganic filler.
(A) Epoxy Resin.
The epoxy resin used in the present invention may be, but not particularly limited to, a bisphenol A type epoxy resin, a bisphenol F type epoxy resin, a bisphenol S type epoxy resin, a bisphenol AF type epoxy resin, a phenol novolac type epoxy resin, a tert-butyl-catechol type epoxy resin, a naphthol type epoxy resin, a naphthalene type epoxy resin, a naphthylene ether type epoxy resin, a glycidyl amine type epoxy resin, a cresol novolac type epoxy resin, a biphenyl type epoxy resin, an anthracene type epoxy resin, a linear aliphatic epoxy resin, an epoxy resin having a butadiene structure, an alicyclic epoxy resin, a heterocyclic epoxy resin, a Spiro ring-containing epoxy resin, a cyclohexane dimethanol type epoxy resin, a trimethylol type epoxy resin, and a halogenated epoxy resin. These may be used alone or in combination of two or more kinds thereof.

Among these, from the viewpoints of improving the heat resistance, the insulation reliability and the adhesion to a metal foil, a bisphenol A type epoxy resin, a naphthol type epoxy resin, a naphthalene type epoxy resin, a biphenyl type epoxy resin, a naphthylene ether type epoxy resin, an anthracene type epoxy resin, and an epoxy resin having a butadiene structure are preferable. Specific examples thereof may include a bisphenol A type epoxy resin ("Epicoat 828EL" and "YL980" available from Mitsubishi Chemical Corporation), a bisphenol F type epoxy resin ("jER806H" and "YL983U" available from Mitsubishi Chemical Corporation), a naphthalene type difunctional epoxy resin ("HP4032," "HP4032D," "HP4032SS," and "XA4032SS" available from DIC Corporation), a naphthalene type tetrafunctional epoxy resin ("HP4700" and "HP4710" available from DIC Corporation), a naphthol type epoxy resin ("ESN-475V" available from Tohto Kasei Co., Ltd.), an epoxy resin having a butadiene structure ("PB-3600" available from Daicel Chemical Industries, Ltd.), an epoxy resin having a biphenyl structure ("NC3000H," "NC3000L," and "NC3100" available from NIPPON KAYAKU Co., Ltd., and "YX4000," "YX4000H," "YX4000HK," and "YL6121" available from Mitsubishi Chemical Corporation), an anthracene type epoxy resin ("YX8800" available from Mitsubishi Chemical Corporation), and a naphthylene ether type epoxy resin ("EXA-7310," "EXA-7311," "EXA-7311L," and "EXA7311-G3" available from DIC Corporation).

The epoxy resin may be used in combination of two or more kinds thereof. It is preferable that the epoxy resin contains an epoxy resin having two or more epoxy groups within the molecule. In particular, it is more preferable that the epoxy resin contains an aromatic epoxy resin that has two or more epoxy groups within the molecule and is liquid at a temperature of 20° C. (hereinafter referred to as "liquid epoxy resin") and an aromatic epoxy resin that has three or more epoxy groups within the molecule and is solid at a temperature of 20° C. (hereinafter referred to as "solid epoxy resin"). The aromatic epoxy resin as used in the present invention means an epoxy resin having an aromatic ring structure in its molecule. When a liquid epoxy resin and a solid epoxy resin are used in combination as the epoxy resin, a mixing ratio (liquid epoxy resin:solid epoxy resin) by mass preferably falls within a range of 1:0.1 to 1:2, more preferably within a range of 1:0.3 to 1:1.8, and still more preferably within a range of 1:0.6 to 1:1.5, from the viewpoints of the resin composition being moderately flexible when used in a form of adhesive film and a cured product of the resin composition having an appropriate breaking strength.

The liquid epoxy resin is preferably a bisphenol A type epoxy resin, a bisphenol F type epoxy resin, a phenol novolac type epoxy resin, or a naphthalene type epoxy resin, and more preferably a naphthalene type epoxy resin. These may be used alone or in combination of two or more kinds thereof.

The solid epoxy resin is preferably a naphthalene type tetrafunctional epoxy resin, a cresol novolac type epoxy resin, a dicyclopentadiene type epoxy resin, a trisphenol type epoxy resin, a naphthol novolac type epoxy resin, a biphenyl type epoxy resin, or a naphthylene ether type epoxy resin, and more preferably a naphthalene type tetrafunctional epoxy resin, a biphenyl type epoxy resin, or a naphthylene ether type epoxy resin. These may be used alone or in combination of two or more kinds thereof.

In the resin composition of the present invention, from the viewpoints of improving the mechanical strength and water resistance of the cured product of the resin composition, the content of the epoxy resin is preferably 3 to 40% by mass, more preferably 5 to 35% by mass, and still more preferably 10 to 30% by mass, when a content of non-volatile components in the resin composition is defined as 100% by mass.

(B) Alkoxy Oligomer.

The alkoxy oligomer (B) used in the present invention refers to a low molecular resin having both an organic group and an alkoxysilyl group, and may be, not particularly limited to, a methyl group-containing alkoxysilyl resin, a phenyl group-containing alkoxysilyl resin, an epoxy group-containing alkoxysilyl resin, a mercapto group-containing alkoxysilyl resin, an amino group-containing alkoxysilyl resin, an acrylic group-containing alkoxysilyl resin, a methacrylic group-containing alkoxysilyl resin, a ureido group-containing alkoxysilyl resin, an isocyanate group-containing alkoxysilyl resin, and a vinyl group-containing alkoxysilyl resin. Among these, an epoxy group-containing alkoxysilyl resin, a mercapto group-containing alkoxysilyl resin, and an amino group-containing alkoxysilyl resin are preferable, and an amino group-containing alkoxysilyl resin is more preferable. These may be used alone or in combination of two or more kinds thereof. The alkoxy oligomer may have one kind or two or more kinds of organic groups.

Specifically, the alkoxy oligomer (B) may be a glycidoxypropyl group-containing alkoxysilyl resin, an aminopropyl group-containing alkoxysilyl resin, an N-2-(aminoethyl)-3-aminopropyl group-containing alkoxysilyl resin, an N-phenyl-3-aminopropyl group-containing alkoxysilyl resin, a methacryloxypropyl group-containing alkoxysilyl resin, an acryloxypropyl group-containing alkoxysilyl resin, a mercaptopropyl group-containing alkoxysilyl resin, a ureidopropyl group-containing alkoxysilyl resin, and an isocyanatopropyl group-containing alkoxysilyl resin. Among them, a glycidoxypropyl group-containing alkoxysilyl resin, an aminopropyl group-containing alkoxysilyl resin, an N-2-(aminoethyl)-3-aminopropyl group-containing alkoxysilyl resin, an N-phenyl-3-aminopropyl group-containing alkoxysilyl resin, and a mercaptopropyl group-containing alkoxysilyl resin are preferable, a 3-aminopropyl group-containing alkoxysilyl resin, an N-2-(aminoethyl)-3-aminopropyl group-containing alkoxysilyl resin, and an N-phenyl-3-aminopropyl group-containing alkoxysilyl resin are more preferable, and an N-phenyl-3-aminopropyl group-containing alkoxysilyl resin is still more preferable.

More specifically, the alkoxy oligomer (B) may be a glycidoxypropyl group-containing methoxysilyl resin, an aminopropyl group-containing methoxysilyl resin, an aminopropyl group-containing ethoxysilyl resin, an N-2-(aminoethyl)-3-aminopropyl group-containing methoxysilyl resin, an N-phenyl-3-aminopropyl group-containing methoxysilyl resin, a methacryloxypropyl group-containing methoxysilyl resin, an acryloxypropyl group-containing methoxysilyl resin, a mercaptopropyl group-containing methoxysilyl resin, a ureidopropyl group-containing ethoxysilyl resin, and an isocyanatopropyl group-containing ethoxysilyl resin. Among them, a glycidoxypropyl group-containing methoxysilyl resin, an aminopropyl group-containing methoxysilyl resin, an aminopropyl group-containing ethoxysilyl resin, an N-2-(aminoethyl)-3-aminopropyl group-containing methoxysilyl resin, an N-phenyl-3-aminopropyl group-containing methoxysilyl resin, and a mercaptopropyl group-containing methoxysilyl resin are preferable, a 3-aminopropyl group-containing methoxysilyl resin, a 3-aminopropyl group-containing ethoxysilyl resin, an N-2-(aminoethyl)-3-aminopropyl group-containing methoxysilyl resin, and an N-phenyl-3-aminopropyl group-containing methoxysilyl resin are more preferable, and an N-phenyl-3-aminopropyl group-containing methoxysilyl resin is still more preferable.

More specifically, the alkoxy oligomer (B) can be represented by a structure of the following formula (1).

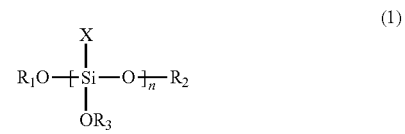

(1)

In the formula (1), $R_1$, $R_2$ and $R_3$ are each independently a linear or branched alkyl group having 1 to 10 carbon atoms, preferably a linear or branched alkyl group having 1 to 5 carbon atoms, more preferably a linear or branched alkyl group having 1 to 4 carbon atoms, still more preferably a methyl group, an ethyl group, a propyl group, an isopropyl group, a 1-methylpropyl group, a butyl group, an isobutyl group or a tert-butyl group, yet still more preferably a methyl group, an ethyl group, a propyl group or an isopropyl group, and particularly preferably a methyl group or an ethyl group. A plurality of $R_3$ may be the same as or different from each other.

In the formula (1), X is a lower alkyl group, a glycidoxyalkyl group, an aminoalkyl group, a mercaptoalkyl group, an acryloxyalkyl group, a methacryloxyalkyl group, a ureidoalkyl group, an isocyanatoalkyl group, or a vinylalkyl group. X is preferably a glycidoxypropyl group, an aminopropyl group, an N-2-(aminoethyl)-3-aminopropyl group, an N-phenyl-3-aminopropyl group, a methacryloxypropyl group, an acryloxypropyl group, a mercaptopropyl group, a ureidopropyl group or an isocyanatopropyl group, more preferably a glycidoxypropyl group, an aminopropyl group, an N-2-(aminoethyl)-3-aminopropyl group, an N-phenyl-3-aminopropyl group or a mercaptopropyl group, still more preferably a 3-aminopropyl group, an N-2-(aminoethyl)-3-aminopropyl group or an N-phenyl-3-aminopropyl group, and yet still more preferably an N-phenyl-3-aminopropyl group. X may be one kind or two or more kinds. Thus, a plurality of X may be the same as or different from each other.

In the formula (1), n is an integer of 2 to 10, preferably an integer of 2 to 8, more preferably an integer of 2 to 6, and still more preferably an integer of 3 to 5.

From the viewpoints of reducing the volatility to improve the handleability, improving the dispersibility, and reducing the amount of alcohol by-product, the weight average molecular weight of the alkoxy oligomer (B) is preferably 350 to 10,000, more preferably 400 to 5,000, and still more preferably 500 to 3,000. The weight average molecular weight in the present invention is measured by a gel permeation chromatography (GPC) method (in terms of polystyrene). In the GPC method, the weight average molecular weight can be specifically determined at a column temperature of 40° C. using LC-9A/RID-6A manufactured by Shimadzu Corporation as a measurement apparatus, Shodex K-800P/K-804L/K-804L manufactured by Showa Denko K.K. as columns, and chloroform or the like as a mobile phase, and carrying out calculation using a calibration curve of a standard polystyrene.

From the viewpoint of preventing volatilization to improve the handleability, the viscosity (25° C.) of the alkoxy oligomer (B) is preferably 10 mm$^2$/s or more, more preferably 20 mm$^2$/s or more, still more preferably 30 mm$^2$/s or more, yet still more preferably 40 mm$^2$/s or more, especially preferably 50 mm$^2$/s or more, particularly preferably 100 mm$^2$/s or more, more particularly preferably 150 mm$^2$/s or more, and most preferably 200 mm$^2$/s or more. On the other hand, from the viewpoint of efficiently coating an inorganic filler, the viscosity thereof is preferably 2,000 mm$^2$/s or less, more preferably 1,800 mm$^2$/s or less, still more preferably 1,600 mm$^2$/s or less, yet still more preferably 1,500 mm$^2$/s or less, particularly preferably 1,400 mm$^2$/s or less, more particularly preferably 1,300 mm$^2$/s or less, and most preferably 1,200 mm$^2$/s or less. The viscosity (25° C.) in the present invention can be measured by the following procedure. About 0.2 mL of the alkoxy oligomer is injected using a syringe to an E-type viscometer (RE-80 manufactured by TOKI SANGYO CO., LTD.) adjusted at 25° C., and the viscosity (25° C.) can be measured at a rotation speed of 5 to 20 rpm with the E-type viscometer.

The method for preparing an alkoxy oligomer is not particularly limited. An alkoxy oligomer can be prepared by such a known method as disclosed in Japanese Patent No. 3474007, which is incorporated herein by reference in its entirety, and can be obtained by a reaction of partially hydrolysing alkoxy group of a silane coupling agent as a monomer and polycondensing it. For example, a silane coupling agent and an organic solvent are placed in a reaction vessel, and subjected to a hydrolysis-condensation reaction at 20 to 80° C. for 0.1 to 10 hours. At this time, an aqueous hydrochloric acid solution, a fluorine-containing compound, or the like can be used as a catalyst. After the reaction, the used catalyst can be removed by distilling an alcohol by-product and then filtrating, or by converting into a highly-hydrophobic organic solvent system and washing with water. A known post-treatment method can be employed, such as a method in which a small amount of moisture in a product is removed by a drying agent or an azeotropic dehydration and the solvent is then volatilized.

An alkoxy oligomer to be used may be a commercially available product. The commercially available alkoxy oligomer may be an epoxy group-containing alkoxysilyl resin ("X-41-1053," and "X-41-1059A" available from Shin-Etsu Chemical Co., Ltd.), an alkoxysilyl resin containing a methyl group and an epoxy group ("X-41-1056" available from Shin-Etsu Chemical Co., Ltd.), a primary amino group-containing alkoxysilyl resin ("X-40-2651" available from Shin-Etsu Chemical Co., Ltd.), an aminophenyl group-containing alkoxysilyl resin ("X-40-9281" available from Shin-Etsu Chemical Co., Ltd.), a mercapto group-containing alkoxysilyl resin ("X-40-1805," and "X-41-1818" available from Shin-Etsu Chemical Co., Ltd.), an alkoxysilyl resin containing a methyl group and a mercapto group ("X-41-1810" available from Shin-Etsu Chemical Co., Ltd.), an alkoxysilyl resin containing a methyl group and an amino group ("X-40-2651" available from Shin-Etsu Chemical Co., Ltd.), an alkoxysilyl resin containing a methyl group and a methacrylic group ("X-40-2655A" available from Shin-Etsu Chemical Co., Ltd.), an alkoxysilyl resin containing a methyl group and an acrylic group ("KR-513" available from Shin-Etsu Chemical Co., Ltd.), a methyl group-containing alkoxysilyl resin ("KC-89S," "KR-500," "X-40-9225," "X-40-9246," and "X-40-9250" available from Shin-Etsu Chemical Co., Ltd.), and an alkoxysilyl resin containing a methyl group and a phenyl group ("KR-401N," "X-40-9227," "X-40-9247," "KR-510," "KR-9218," and "KR-213" available from Shin-Etsu Chemical Co., Ltd.).

(C) Inorganic Filler.

The inorganic filler (C) used in the present invention is not particularly limited. Examples thereof may include silica, alumina, barium sulfate, talc, clay, a mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. Among these, silica is preferable. Further, silica such as amorphous silica, pulverized silica, fumed silica, crystalline silica, synthetic silica and hollow silica are preferable, and fumed silica is more preferable. Spherical silica is preferable as the silica. These may be used alone or in combination of two or more kinds thereof.

The average particle diameter of the inorganic filler is not particularly limited. From the viewpoint of forming a fine wiring on an insulating layer, the upper limit of the average particle diameter of the inorganic filler is preferably 5 μm or less, more preferably 3 μm or less, still more preferably 1 μm or less, yet still more preferably 0.7 μm or less, particularly preferably 0.5 μm or less, more particularly preferably 0.4 μm or less, and most preferably 0.3 μm or less. On the other hand, the lower limit of the average particle diameter of the inorganic filler is preferably 0.01 μM or more, more preferably 0.03 μm or more, still more preferably 0.05 μm or more, yet still more preferably 0.07 μm or more, and particularly preferably 0.1 μm or more, from the viewpoint that, when forming a resin composition varnish from an epoxy resin composition, a reduction of the handleability due to an increase in the viscosity of the varnish can be prevented. The average particle diameter of the inorganic filler can be measured by a laser diffraction and scattering method on the basis of the Mie scattering theory. Specifically, the particle size distribution of the inorganic filler is prepared on the volume basis using a laser diffraction particle size distribution measuring device, and a median diameter thereof can be measured as an average particle diameter. As a measurement sample, there can be preferably used a dispersion in which the inorganic filler is dispersed in water by ultrasonification. As the laser diffraction particle size distribution measuring device, LA-500, 750, and 950 manufactured by Horiba, Ltd., or the like can be used.

Although the content of the inorganic filler varies depending upon characteristics required for the resin composition, it is preferably from 20 to 85% by mass, more preferably from 30 to 80% by mass, still more preferably from 40 to 75% by mass, and yet still more preferably from 50 to 70% by mass when a content of non-volatile components in the resin composition is defined as 100% by mass. When the content of the inorganic filler is too small, the thermal expansion coefficient of the cured product tends to be high. When the content is too large, there is a tendency that the cured product becomes brittle and the peel strength is lowered.

In the resin composition of the present invention, at least part of the alkoxy oligomer (B) may be reacted with the inorganic filler (C) to form a reaction product.

As used herein, the "reaction" between the alkoxy oligomer (B) and the inorganic filler (C) represents a condensation reaction between an alkoxy group of the alkoxy oligomer (B) and a surface hydroxyl group of the inorganic filler (C), specifically a hydrolysis and dehydration condensation reaction or a dealcoholization condensation reaction therebetween. Therefore, the "reaction product" formed by reacting the alkoxy oligomer (B) with the inorganic filler (C) represents a condensate of the alkoxy oligomer (B) and the inorganic filler (C). In such a condensate, the alkoxy oligomer (B) is covalently bound to the surface of the inorganic filler (C).

The formation of reaction product (that is, condensate) between the alkoxy oligomer (B) and the inorganic filler (C) can be confirmed, for instance, from the presence of a carbon atom when conducting analysis of a surface composition of the inorganic filler using a carbon analyzer. As the carbon analyzer, "EMIA-320V" manufactured by Horiba, Ltd., or the like can be used.

The degree of the reaction between the alkoxy oligomer (B) and the inorganic filler (C) can be quantified by using a two-component system of the alkoxy oligomer (B) and the inorganic filler (C) as a model reaction system and measuring the carbon amount per unit surface area of the inorganic filler (C) after washing the model reaction system with a solvent (for example, methyl ethyl ketone (MEK)). Specifically, the quantification can be accomplished by the following procedure. A sufficient amount of MEK as a solvent is added to the model reaction system of the two-component system of the alkoxy oligomer (B) and the inorganic filler (C) and the resultant mixture is subjected to ultrasonic washing at 25° C. for 5 minutes. A supernatant liquid is removed and a solid content is dried. Then, a carbon amount per unit surface area of the inorganic filler (C) is measured with a carbon analyzer. The measured value of carbon amount represents an amount of carbon atom in the alkoxy oligomer (B) that has been reacted with the inorganic filler (C) (to form a condensate) per unit surface area of the inorganic filler (C), that is, a value of [amount (mg) of carbon atom in the alkoxy oligomer (B) reacted with the inorganic filler (C)/surface area ($m^2$) of the inorganic filler (C)]. When the measured value of carbon amount is more than zero, it can be said that "at least part of the alkoxy oligomer (B) is reacted with the inorganic filler (C) to form a reaction product."

The carbon amount per unit surface area of the inorganic filler (C) varies depending on the kinds of the alkoxy oligomer (B) and the inorganic filler (C) and the amount ratio thereof. In terms of improving the dispersibility of the inorganic filler and stabilizing the arithmetic mean roughness and the root mean square roughness of the cured product after the wet roughening step, the carbon amount is preferably 0.05 $mg/m^2$ or more, more preferably 0.10 m $g/m^2$ or more, and still more preferably 0.15 $mg/m^2$ or more. On the other hand, in terms of preventing increases in the melt viscosity of the resin varnish and the melt viscosity in a form of adhesive film, the carbon amount is preferably 1.00 $mg/m^2$ or less, more preferably 0.75 $mg/m^2$ or less, and still more preferably 0.50 $mg/m^2$ or less.

The degree of the reaction for forming the reaction product (i.e., condensate) of the alkoxy oligomer (B) and the inorganic filler (C) may also be represented by [{(quantitative value before reaction)−(quantitative value after reaction)}/(quantitative value before reaction)×100] in relation to the surface hydroxyl group of the inorganic filler (C) (for example, a silanol group showing a specific peak at 3,747 to 3,750 $cm^{-1}$ when a silica is used as the inorganic filler (C)) measured with FT-IR (Fourier transform infrared radiation analyzer). The lower limit of the degree of reaction of the alkoxy oligomer (B) with the inorganic filler (C) is preferably 10%, more preferably 30%, still more preferably 50%, yet still more preferably 70%, particularly preferably 80%, and more particularly preferably 90%. The upper limit of the degree of reaction of the alkoxy oligomer (B) with the inorganic filler (C) is preferably 98%, more preferably 99%, and particularly preferably 100%.

For the inorganic filler (C) or the inorganic filler (C) that has been reacted with at least part of the alkoxy oligomer (B) to form a reaction product used in the present invention, the surface thereof may be treated with a surface treatment agent such as an epoxysilane-based coupling agent, an aminosilane-based coupling agent, a mercaptosilane-based coupling agent, a silane-based coupling agent, an organosilazane compound, and a titanate-based coupling agent within a range not adversely affecting the effects of the present invention. These may be used alone or in combination of two or more kinds thereof. Specifically, the surface treatment agent may be an aminosilane-based coupling agent such as aminopropylmethoxysilane, aminopropyltriethoxysilane, ureidopropyltriethoxysilane, N-phenyl-3-aminopropyltrimethoxysilane, and N-2-(aminoethyl)aminopropyltrimethoxysilane; an epoxysilane-based coupling agent such as glycidoxypropyltrimethoxysilane, glycidoxypropyltriethoxysilane, glycidoxypropylmethyldiethoxysilane, glycidylbutyltrimethoxysilane, and (3,4-epoxycyclohexyl)ethyltrimethoxysilane; a mercaptosilane-based coupling agent such as mercaptopropyltrimethoxysilane and mercaptopropyltriethoxysilane; a silane-based coupling agent such as methyltrimethoxysilane, octadecyltrimethoxysilane, phenyltrimethoxysilane, methacryloxypropyltrimethoxysilane, imidazole silane, and triazine silane; an organosilazane compound such as hexamethyldisilazane, hexaphenyldisilazane, trisilazane, cyclotrisilazane, and 1,1,3,3,5,5-hexamethylcyclotrisilazane; and a titanate-based coupling agent such as butyl titanate dimer, titanium octylene glycolate, diisopropoxytitanium bis(triethanolaminate), dihydroxytitanium bislactate, dihydroxybis(ammonium lactato) titanium, bis(dioctylpyrophosphate)ethylene titanate, bis(dioctylpyrophosphate)oxyacetate titanate, tri-n-butoxytitanium monostearate, tetra-n-butyl titanate, tetra(2-ethylhexyl)titanate, tetraisopropyl bis(dioctylphosphite) titanate, tetraoctyl bis(ditridecylphosphite) titanate, tetra(2,2-diallyloxymethyl-1-butyl)bis(ditridecyl)phosphite titanate, isopropyltrioctanoyl titanate, isopropyltricumylphenyl titanate, isopropyltriisostearoyl titanate, isopropylisostearoyldiacryl titanate, isopropyldimethacrylisostearoyl titanate, isopropyl tri(dioctylphosphato) titanate, isopropyltridodecylbenzenesulfonyl titanate, isopropyltris(dioctylpyrophosphate) titanate, and isopropyl tri(N-amidoethyl-aminoethyl)titanate. Commercially available products thereof may be "KBM403" (3-glycidoxypropyltrimethoxysilane) available from Shin-Etsu Chemical Co., Ltd., "KBM803" (3-mercaptopropyltrimethoxysilane) available from Shin-Etsu Chemical Co., Ltd., "KBE903" (3-aminopropyltriethoxysilane) available from Shin-Etsu Chemical Co., Ltd., and "KBM573" (N-phenyl-3-aminopropyltrimethoxysilane) available from Shin-Etsu Chemical Co., Ltd.

Among these, the use of the inorganic filler (C) the surface of which is treated with an organosilazane compound is advantageous from the viewpoints of improving the dispersibility of the resin varnish and increasing the coverage of the inorganic filler with the alkoxy oligomer. In particular, hexamethyldisilazane is preferable. When using the inorganic filler (C) the surface of which is treated with a surface treatment agent, the alkoxy oligomer (B) may be covalently bonded to the surface of the inorganic filler (C) through the surface treatment agent.

As described below, an insulating layer formed by curing the resin composition of the present invention containing the epoxy resin (A), the alkoxy oligomer (B), and the inorganic filler (C) is capable of forming thereon a plated conductive layer having a sufficient peel strength even when a surface roughness thereof after a wet roughening treatment is low. Such an effect can be accomplished more by using a resin composition in which at least part of the alkoxy oligomer (B) is reacted with the inorganic filler (C) to form a reaction product. The resin composition in which at least part of the alkoxy oligomer (B) is reacted with the inorganic filler (C) to form a reaction product can be suitably obtained by reacting the alkoxy oligomer (B) and the inorganic filler (C) in advance and adding the resultant to the epoxy resin (A) (and other components used as necessary), as described below.

In the resin composition of the present invention, the alkoxy oligomer (B) and the inorganic filler (C) may be added to the resin composition as they are, or the alkoxy oligomer (B) and the inorganic filler (C) are reacted in advance and the resultant may be added thereto. In terms of improving the dispersibility thereof in the resin composition, it is preferable that the alkoxy oligomer (B) and the inorganic filler (C) are reacted in advance and the resultant is added to the resin composition. When the alkoxy oligomer (B) and the inorganic filler (C) are reacted in advance and the resultant is added to the resin composition, the resin composition in which at least part of the alkoxy oligomer (B) is reacted with the inorganic filler (C) to form a reaction product can be suitably obtained, as described above. Examples of a method for reacting the alkoxy oligomer (B) and the inorganic filler (C) in advance may include the following methods.

The inorganic filler (C) is placed in a rotary mixer, and the inorganic filler (C) is stirred for 5 to 30 minutes while spraying a mixture in which the alkoxy oligomer (B) is mixed with methyl ethyl ketone (MEK) in advance, and further stirred at 50 to 150° C. for 0.5 to 3 hours, more preferably at 55 to 130° C. for 0.5 to 3 hours, still more preferably at 60 to 110° C. for 0.5 to 3 hours, and yet still more preferably at 70 to 80° C. for 1 to 3 hours, to react them in advance. After then, a volatile component is distilled away. In addition to the rotary mixer, a drum mixer, a rocking mixer, a vibrating fluidized bed, a powder dryer, or the like can be used. In terms of simple operation, the rotary mixer is preferable. The rotary mixer may be a Henschel type powder blender.

From the viewpoint of preventing an increase in the melt viscosity, the content of the alkoxy oligomer (B) is preferably 5% by mass or less, more preferably 4% by mass or less, still more preferably 3% by mass or less, and yet still more preferably 2% by mass or less, relative to 100% by mass of the inorganic filler (C). From the viewpoints of improving the dispersibility of the resin varnish and the coating ratio of the inorganic filler, the content of the alkoxy oligomer (B) is preferably 0.1% by mass or more, more preferably 0.2% by mass or more, still more preferably 0.3% by mass or more, and yet still more preferably 0.4% by mass or more.

The content is based on supplied amounts of the alkoxy oligomer (B) and inorganic filler (C) that are used in the preparation of the resin composition.

When curing the resin composition of the present invention to form an insulating layer, roughening a surface of the insulating layer, and plating the surface of the insulating layer to form a conductive layer, a peel strength between the conductive layer and the insulating layer can be evaluated by a measurement method as described below in the section entitled "Measurement of peeling strength (peel strength) of plated conductive layer."

The upper limit of the peel strength is preferably 0.8 kgf/cm or less, more preferably 0.9 kgf/cm or less, and still more preferably 1.0 kgf/cm or less. The lower limit of the peel strength is preferably 0.4 kgf/cm or more, and more preferably 0.5 kgf/cm or more.

When curing the resin composition of the present invention to form an insulating layer and roughening a surface of the insulating layer, the arithmetic mean roughness (Ra value) and the root mean square roughness (Rq value) of the surface of the insulating layer after roughening can be evaluated by a measurement method as described below in the section entitled "Measurement of arithmetic mean roughness (Ra value) and root mean square roughness (Rq value) after roughening."

The upper limit of the arithmetic mean roughness (Ra value) is preferably 300 nm or less, more preferably 260 nm or less, still more preferably 240 nm or less, yet still more preferably 220 nm or less, especially preferably 200 nm or less, particularly preferably 170 nm or less, more particularly preferably 160 nm or less, and most preferably 150 nm or less in order to reduce the transmission loss of electrical signal. From the viewpoint of improving the peel strength, the lower limit of the arithmetic mean roughness (Ra value) is preferably 10 nm or more, more preferably 20 nm or more, still more preferably 30 nm or more, yet still more preferably 40 nm or more, and particularly preferably 50 nm or more.

The present inventors have found that the root mean square roughness (Rq value) reflects a local state of the surface of the insulating layer and therefore it can be confirmed based on the Rq value if the insulating layer has a dense and smooth surface. In order to obtain an insulating layer having a dense and smooth surface, the upper limit of the root mean square roughness (Rq value) is preferably 520 nm or less, more preferably 480 nm or less, still more preferably 440 nm or less, yet still more preferably 400 nm or less, especially preferably 360 nm or less, particularly preferably 320 nm or less, more particularly preferably 280 nm or less, and most preferably 240 nm or less. From the viewpoint of improving the peel strength, the lower limit of the root mean square roughness (Rq value) is preferably 10 nm or more, more preferably 30 nm or more, still more preferably 40 nm or more, yet still more preferably 50 nm or more, and particularly more preferably 60 nm or more.

In a preferable embodiment of the resin composition of the present invention, when curing the resin composition to form an insulating layer, roughening a surface of the insulating layer, and plating the surface of the insulating layer to form a conductive layer, the peel strength between the conductive layer and the insulating layer is 0.4 kgf/cm to 1.0 kgf/cm. When curing the resin composition to form an insulating layer and roughening the surface of the insulating layer, the surface of the insulating layer after roughening has the arithmetic mean roughness of 10 nm to 300 nm and the root mean square roughness of 10 to 520 nm.

In a more preferable embodiment of the resin composition of the present invention, when curing the resin composition to form an insulating layer, roughening a surface of the insulating layer, and plating the surface of the insulating layer to form a conductive layer, the peel strength between the conductive layer and the insulating layer is 0.5 kgf/cm to 1.0 kgf/cm. When curing the resin composition to form an insulating layer and roughening a surface of the insulating layer, the surface of the insulating layer after roughening has the arithmetic mean roughness of 10 nm to 150 nm and the root mean square roughness of 10 to 240 nm.

(D) Accelerator.

When the resin composition of the present invention further contains an accelerator, the epoxy resin and the curing agent can be efficiently cured. The accelerator may be, but not particularly limited to, an amine-based accelerator, a guanidine-based accelerator, an imidazole-based accelerator, a phosphonium-based accelerator, and a metal-based accelerator. These may be used alone or in combination of two or more kinds thereof.

The amine-based accelerator may be, but not particularly limited to, trialkylamines such as triethylamine and tributylamine; and amine compounds such as 4-dimethylaminopyridine, benzyldimethylamine, 2,4,6-tris(dimethylaminomethyl)phenol, and 1,8-diazabicyclo[5,4,0]undecene (hereinafter abbreviated as DBU). These may be used alone or in combination of two or more kinds thereof.

The guanidine-based accelerator may be, but not particularly limited to, dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. These may be used alone or in combination of two or more kinds thereof.

The imidazole-based accelerator may be, but not particularly limited to, an imidazole compound such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline, and an adduct of an imidazole compound and an epoxy resin. These may be used alone or in combination of two or more kinds thereof.

The phosphonium-based accelerator may be, but not particularly limited to, triphenylphosphine, a phosphonium borate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate. These may be used alone or in combination of two or more kinds thereof.

The content of the accelerator (except for metal-based accelerator) in the resin composition of the present invention is preferably within a range of 0.005 to 1% by mass, and more preferably within a range of 0.01 to 0.5% by mass, when a content of non-volatile components in the resin composition is defined as 100% by mass. When the content of the accelerator is less than 0.005% by mass, there is a tendency that the curing becomes slow and a long thermal curing time is required. When the content of the accelerator exceeds 1% by mass, there is a tendency that the storage stability of the resin composition is lowered.

The metal-based accelerator may be, but not particularly limited to, organic metal complexes and organic metal salts of a metal such as cobalt, copper, zinc, iron, nickel, manganese, and tin. Specific examples of the organic metal complex may include an organic cobalt complex such as cobalt (II) acetylacetonate and cobalt (III) acetylacetonate, an organic copper complex such as copper (II) acetylacetonate, an organic zinc complex such as zinc (II) acetylacetonate, an organic iron complex such as iron (III) acetylacetonate, an organic nickel complex such as nickel (II) acetylacetonate, and an organic manganese complex such as manganese (II) acetylacetonate. The organic metal salt may be zinc octoate, tin octoate, zinc naphthenate, cobalt naphthenate, tin stearate, and zinc stearate. These may be used alone or in combination of two or more kinds thereof.

Regarding the addition amount of the metal-based accelerator in the resin composition of the present invention, a content of metal derived from the metal-based curing catalyst is preferably within a range of 25 to 500 ppm, and more preferably within a range of 40 to 200 ppm, when a content of non-volatile components in the resin composition is defined as 100% by mass. When the content of the metal is less than 25 ppm, it tends to be difficult to form a conductive layer having an excellent adhesion property on an insulating layer surface with low arithmetic mean roughness. When the content of the metal exceeds 500 ppm, the storage stability and insulating properties of the resin composition tend to be lowered.

(E) Curing Agent.

When the resin composition of the present invention further contains a curing agent, the insulating properties and mechanical characteristics can be improved. The curing agent (E) may be, but is not particularly limited to, a phenol-based curing agent, a naphthol-based curing agent, an active ester-based curing agent, a benzoxazine-based curing agent, a cyanate ester-based curing agent, and an acid anhydride-based curing agent. From the viewpoints of reducing the arithmetic mean roughness (Ra value) and the root mean square roughness (Rq value), a phenol-based curing agent, a naphthol-based curing agent, and an active ester-based curing agent are preferable. These may be used alone or in combination of two or more kinds thereof.

The phenol-based curing agent and the naphthol-based curing agent may include, but not particularly limited to, a phenol-based curing agent having a novolac structure and a naphthol-based curing agent having a novolac structure. A phenol novolac resin, a triazine skeleton-containing phenol novolac resin, a naphthol novolac resin, a naphthol aralkyl type resin, a triazine skeleton-containing naphthol resin, and a biphenyl aralkyl type phenol resin are preferable. A commercially available biphenyl aralkyl type phenol resin may be "MEH-7700," "MEH-7810," "MEH-7851," and "MEH7851-4H" (available from Meiwa Plastic Industries, Ltd.) and "GPH" (available from NIPPON KAYAKU Co., Ltd.), a commercially available naphthol novolac resin may be "NHN" and "CBN" (available from NIPPON KAYAKU Co., Ltd.), a commercially available naphthol aralkyl type resin may be "SN170," "SN180," "SN190," "SN475," "SN485," "SN495," "SN395," and "SN375" (available from Tohto Kasei Co., Ltd.), a commercially available phenol novolac resin may be "TD2090" (available from DIC Corporation), and a commercially available triazine skeleton-containing phenol novolac resin may be "LA3018," "LA7052," "LA7054," and "LA1356" (available from DIC Corporation).

These may be used alone or in combination of two or more kinds thereof.

Although the active ester-based curing agent is not particularly limited, a compound having two or more highly reactive ester groups within the molecule is generally preferably used, such as phenol esters, thiophenol esters, N-hydroxyamine esters, and esters of heterocyclic hydroxy compounds. The active ester-based curing agent is preferably obtained by condensation reaction of a carboxylic acid compound and/or a thiocarboxylic acid compound with a hydroxy compound and/or a thiol compound. In particular, from the viewpoint of improving the heat resistance, an active ester-based curing agent obtained from a carboxylic acid compound and a hydroxy compound is preferable, and an active ester-based curing agent obtained from a carboxylic acid compound and a phenol compound and/or naphthol compound is more preferable. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound or naphthol compound may include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac. The active ester-based curing agents can be used alone or in combination of two or more kinds. As the active ester-based curing agent, the active ester-based curing agent disclosed in JP-A-2004-277460, which is incorporated herein by reference in its entirety, may be used, or a commercially available active ester-based curing agent may be used. The commercially available active ester-based curing agent is preferably an active ester-based curing agent containing a dicyclopentadienyl diphenol structure, an acetylated material of phenol novolac, or a benzoylated material of phenol novolac. Among these, an active ester curing-based agent containing a dicyclopentadienyl diphenol structure is more preferable. Specifically, the active ester-based curing agent containing a dicyclopentadienyl diphenol structure may be EXB9451, EXB9460, EXB9460S-65T, and HPC-8000-65T (available from DIC Corporation, active group equivalent weight: about 223), the acetylated material of phenol novolac may be DC808 (available from JER Co., Ltd., active group equivalent weight: about 149), and the benzoylated material of phenol novolac may be YLH1026 (available from JER Co., Ltd., active group equivalent weight: about 200), YLH1030 (available from JER Co., Ltd., active group equivalent weight: about 201), and YLH1048 (available from JER Co., Ltd., active group equivalent weight: about 245). Among these, from the viewpoints of the storage stability of the varnish and the thermal expansion coefficient of the cured product, EXB9460S is preferable.

More specifically, the active ester-based compound containing a dicyclopentadienyl diphenol structure may be a compound of the following formula (2).

In the formula, R is a phenyl group or a naphthyl group, k represents 0 or 1, and n is an average number of repeating units and is 0.05 to 2.5.

From the viewpoints of reducing the dielectric dissipation factor and improving the heat resistance, R is preferably a naphthyl group, k is preferably 0, and n is preferably 0.25 to 1.5.

Specific examples of the benzoxazine-based curing agent may include, but not particularly limited to, F-a and P-d (available from Shikoku Chemicals Corporation) and HFB2006M (available from Showa High Polymer Co., Ltd.).

Examples of the cyanate ester-based curing agent may include, but not particularly limited to, a novolac type (phenol novolac type, alkyl phenol novolac type, etc.) cyanate ester-based curing agent, a dicyclopentadiene type cyanate ester-based curing agent, a bisphenol type (bisphenol A type, bisphenol F type, and bisphenol S type, etc.) cyanate ester-based curing agent, and a prepolymer in which these curing agents are partly triazinized. Although the weight average molecular weight of the cyanate ester-based curing agent is not particularly limited, it is preferably 500 to 4,500, and more preferably 600 to 3,000. Specific examples of the cyanate ester-based curing agent may include: a difunctional cyanate resin such as bisphenol A dicyanate, polyphenol cyanate (oligo(3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; a polyfunctional cyanate resin derived from a phenol novolac, cresol novolac, or dicyclopentadiene structure-containing phenol resin or the like; and a prepolymer in which these cyanate esters are partly triazinized. These may be used alone or in combination of two or more kinds thereof. A commercially available cyanate ester resin may be a phenol novolac type polyfunctional cyanate ester resin represented by the following formula (3) (available from Lonza Japan Ltd., PT30, cyanate equivalent weight: 124), a prepolymer in which bisphenol A dicyanate is partly or entirely triazinized to form a trimer, represented by the following formula (4) (available from Lonza Japan Ltd., BA230, cyanate equivalent weight: 232), and a dicyclopentadiene structure-containing cyanate ester resin represented by the following formula (5) (available from Lonza Japan Ltd., DT-4000 and DT-7000).

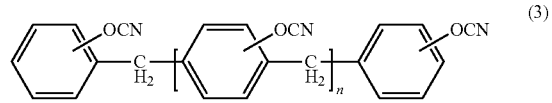

In the formula, n represents an arbitrary number (preferably 0 to 20) as an average value.

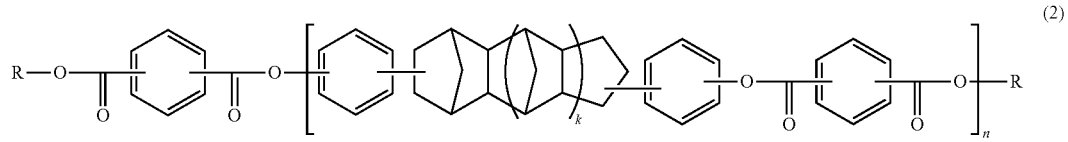

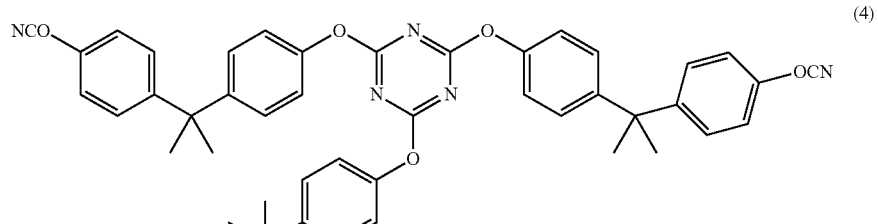

(4)

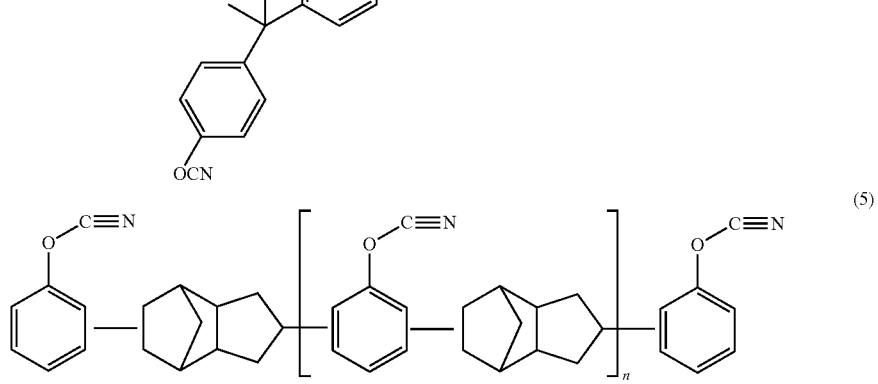

(5)

In the formula, n represents a number of 0 to 5 as an average value.

The acid anhydride-based curing agent may be, but not particularly limited to, phthalic anhydride, tetrahydrophthalic anhydride, hexahydrophthalic anhydride, methyltetrahydrophthalic anhydride, methylhexahydrophthalic anhydride, methyl nadic anhydride, hydrogenated methyl nadic anhydride, trialkyltetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, pyromellitic anhydride, benzophenone tetracarboxylic dianhydride, biphenyl tetracarboxylic dianhydride, naphthalene tetracarboxylic dianhydride, oxydiphthalic dianhydride, 3,3'-4,4'-diphenylsulfone tetracarboxylic dianhydride, 1,3,3a,4,5,9b-hexahydro-5-(tetrahydro-2,5-dioxo-3-furanyl)-naphto[1,2-c]furan-1,3-dione,
ethylene glycol bis(anhydrotrimellitate), and a polymer type acid anhydride such as a styrene-maleic acid resin obtained by copolymerization of styrene and maleic acid.

In the resin composition of the present invention, from the viewpoints of improving the mechanical strength and water resistance of the cured product of the resin composition, the ratio of the total number of epoxy groups in the epoxy resin (A) to the total number of reactive groups in the curing agent (E) is preferably 1:0.2 to 1:2, more preferably 1:0.3 to 1:1.5, and still more preferably 1:0.4 to 1:1. The total number of epoxy groups in the epoxy resin in the resin composition is a value obtained by dividing the mass of solid content in each epoxy resin by respective epoxy equivalent weights and summing the calculated values for all epoxy resins. The total number of reactive groups in the curing agent is a value obtained by dividing the mass of solid content in each curing agent by respective reactive group equivalent weights and summing the calculated values for all curing agents.

(F) Thermoplastic Resin.

When the resin composition of the present invention further contains (F) a thermoplastic resin, the mechanical strength of the cured product can be improved. Furthermore, in the case of using the resin composition in a form of adhesive film, the film molding capability can also be improved.

Such a thermoplastic resin may be a phenoxy resin, a polyimide resin, a polyamideimide resin, a polyetherimide resin, a polysulfone resin, a polyethersulfone resin, a polyphenylene ether resin, a polycarbonate resin, a polyetherether ketone resin, and a polyester resin. These thermoplastic resins may be used alone or in combinations of two or more kinds thereof. The weight average molecular weight of the thermoplastic resin is preferably within a range of 5,000 to 200,000. When the weight average molecular weight is less than this range, the effects for improving the film molding capability and the mechanical strength are unlikely to be sufficiently exhibited. When the weight average molecular weight is more than this range, the compatibility with the cyanate ester resin and the naphthol-type epoxy resin is not sufficient, the surface irregularity after curing is increased, and the formation of a high-density fine wiring tends to be difficult. The weight average molecular weight in the present invention is measured by a gel permeation chromatography (GPC) method (in terms of polystyrene). Specifically, in the GPC method, the weight average molecular weight can be determined at a column temperature of 40° C. using LC-9A/RID-6A manufactured by Shimadzu Corporation as a measurement apparatus, Shodex K-800P/K-804L/K-804L manufactured by Showa Denko K.K. as columns, and chloroform or the like as a mobile phase, and carrying out calculation using a calibration curve of standard polystyrene.

When the thermoplastic resin (F) is mixed in the resin composition of the present invention, the content of the thermoplastic resin in the resin composition is not particularly limited, and is preferably 0.1 to 10% by mass, and more preferably from 1 to 5% by mass, relative to 100% by mass of non-volatile components in the resin composition. When the content of the thermoplastic resin is too small, the effects for improving the film molding capability and the mechanical strength are unlikely to be exhibited. When the content of the thermoplastic resin is too large, there is a tendency that the melt viscosity is increased and the arithmetic mean roughness of the surface of the insulating layer after the wet roughening step is increased.

(G) Rubber Particle.

When the resin composition of the present invention further contains (G) a rubber particle, the plating peel strength can be improved, and effects for improving the drill processing properties, reducing the dielectric dissipation factor, and relieving the stress can be obtained. The rubber particle which can be used in the present invention is, for example, one that is insoluble in an organic solvent used for the preparation of a varnish of the resin composition and incompatible with the cyanate ester resin and the epoxy resin as the essential component. Therefore, the rubber particle is present in a dispersed state in the varnish of the resin composition of the present invention. In general, such a rubber particle can be prepared by increasing the molecular weight of the rubber component to such an extent that the rubber component is insoluble in the organic solvent and the resin, and converting it into a granular state.

Preferable examples of the rubber particle which can be used in the present invention may include a core-shell type rubber particle, a cross-linked acrylonitrile-butadiene rubber particle, a cross-linked styrene-butadiene rubber particle, and an acrylic rubber particle. The core-shell type rubber particle is a rubber particle having a core layer and a shell layer, and examples thereof may include a two-layer structure in which the shell layer as an external layer is made of a glassy polymer and the core layer as an internal layer is made of a rubbery polymer; and a three-layer structure in which the shell layer as an external layer is made of a glassy polymer, an interlayer is made of a rubbery polymer, and the core layer is made of a glassy polymer. The glassy polymer layer is made of, for example, a polymer of methyl methacrylate, and the rubbery polymer layer is made of, for example, a butyl acrylate polymer (butyl rubber). The rubber particle may be used in combinations of two or more kinds thereof. Specific examples of the core-shell type rubber particle may include Staphyloid AC3832, AC3816N, IM-401 Modified 1, and IM-401 Modified 7-17 (trade name, available from Ganz Chemical Co., Ltd.), and METABLEN KW-4426 (trade name, available from MITSUBISHI RAYON CO., LTD.). Specific examples of the crosslinked acrylonitrile butadiene rubber (NBR) particle may include XER-91 (average particle diameter: 0.5 µm, available from JSR Corporation). Specific examples of the crosslinked styrene butadiene rubber (SBR) particle may include XSK-500 (average particle diameter: 0.5 µm, available from JSR Corporation). Specific examples of the acrylic rubber particle may include METABLEN W300A (average particle diameter: 0.1 µm) and W450A (average particle diameter: 0.2 µm) (available from MITSUBISHI RAYON CO., LTD.).

An average particle diameter of the rubber particle to be mixed is preferably within a range of 0.005 to 1 µm, and more preferably within a range of 0.2 to 0.6 µm. The average particle diameter of the rubber particle used in the present invention can be measured by a dynamic light scattering method. For example, the measurement can be carried out by uniformly dispersing the rubber particles in an appropriate organic solvent by ultrasonic wave or the like, preparing the particle size distribution of the rubber particle using a concentrated system particle size analyzer (FPAR-1000, manufactured by Otsuka Electronics Co., Ltd.) on a mass basis, and defining its median diameter as the average particle diameter.

The content of the rubber particle is preferably 0.05 to 10% by mass, and more preferably 0.5 to 5% by mass, relative to 100% by mass of non-volatile components in the resin composition.

(H) Flame Retardant.

When the resin composition of the present invention further contains (H) a flame retardant, flame retardancy can be imparted to the composition. Examples of the flame retardant may include an organic phosphorus-based flame retardant, an organic nitrogen-containing phosphorus compound, a nitrogen compound, a silicone-based flame retardant, and metal hydroxide. The organic phosphorus-based flame retardant may be a phenanthrene type phosphorus compound such as HCA, HCA-HQ, and HCA-NQ, available from SANKO CO., LTD., a phosphorus-containing benzoxazine compound such as HFB-2006M available from Showa High Polymer Co., Ltd., a phosphate ester compound such as REOFOS 30, 50, 65, 90, 110, TPP, RPD, BAPP, CPD, TCP, TXP, TBP, TOP, KP140, and TIBP, available from Ajinomoto Fine-Techno Co., Inc., TPPO and PPQ available from HOKKO CHEMICAL INDUSTRY CO., LTD., OP930 available from Clariant Ltd., and PX200 available from DAIHACHI CHEMICAL INDUSTRY CO., LTD., a phosphorus-containing epoxy resin such as FX289, FX305, and TX0712, available from Tohto Kasei Co., Ltd., a phosphorus-containing phenoxy resin such as ERF001 available from Tohto Kasei Co., Ltd., and a phosphorus-containing epoxy resin such as YL7613 available from Japan Epoxy Resin Co., Ltd. The organic nitrogen-containing phosphorus compound may be a phosphate ester amide compound such as SP670 and SP703, available from Shikoku Chemicals Corporation, and a phosphazene compound such as SPB100 and SPE100, available from Otsuka Chemical Co., Ltd. and FP-series available from FUSHIMI Pharmaceutical Co., Ltd. Metal hydroxide may be magnesium hydroxide such as UD65, UD650, and UD653, available from Ube Material Industries, Ltd., and aluminum hydroxide such as B-30, B-325, B-315, B-308, B-303, and UFH-20, available from Tomoe Engineering Co., Ltd.

The content of the flame retardant is preferably 0.5 to 10% by mass, and more preferably 1 to 5% by mass, relative to 100% by mass of non-volatile components in the resin composition.

Other Components.

If necessary, other components can be mixed in the resin composition of the present invention within a range not adversely affecting the effects of the present invention. The other components may be a thermosetting resin such as a vinyl benzyl compound, an acrylic compound, a maleimide compound, and a block isocyanate compound; an organic filler such as a silicon powder, a nylon powder, and fluorine powder; a thickener such as Orben and Bentone; a silicone-based, fluorine-based, or polymer-based defoaming agent or leveling agent; an adhesion imparting agent such as imidazole-based, thiazole-based, triazole-based, and silane-based coupling agents; and a colorant such as phthalocyanine blue, phthalocyanine green, iodine green, disazo yellow, and carbon black.

The method for preparing the resin composition of the present invention is not particularly limited, and examples thereof may include a method of mixing blending components using a rotary mixer or the like with, if necessary, a solvent or the like.

The application of the resin composition of the present invention is not particularly limited. The resin composition can be used over a wide range of application where the resin composition is required, including an insulating resin sheet such as an adhesive film and a prepreg, a circuit substrate (applications for a laminate, a multilayered printed wiring board, etc.), a solder resist, an under fill material, a die bonding material, a semiconductor sealing material, a hole plugging resin, and a module-embedding resin. Among these, the resin composition of the present invention can be suitably used as a resin composition for forming an insulating layer in the manufacture of the multilayered printed wiring board (resin composition for an insulating layer of a multilayered printed wiring board). Furthermore, the resin composition of the present invention can be suitably used as a resin composition for forming an insulating layer on which a conductive layer is formed by plating in the manufacture of the multilayered printed wiring board (resin composition for an insulating layer of a multilayered printed wiring board on which a conductive layer is formed by plating). Although the resin composition of the present invention can be applied to a circuit substrate in a varnish state to form an insulating layer, it is industrially preferable, in general, to use the resin composition in a form of a sheet-shaped laminated material such as an adhesive film and a prepreg. From the viewpoint of lamination properties of the sheet-shaped laminated material, the softening point of the resin composition is preferably 40 to 150° C.

Adhesive Film.

The adhesive film of the present invention can be manufactured by a method known to those skilled in the art, for example, by preparing a resin varnish in which the resin composition is dissolved in an organic solvent, applying the resin varnish to a support with a die coater or the like, and further drying the organic solvent by heating, blowing hot air, or the like, thereby forming a resin composition layer.

Examples of the organic solvent may include ketones such as acetone, methyl ethyl ketone and cyclohexanone; acetate esters such as ethyl acetate, butyl acetate, cellosolve acetate, propylenegylcol monomethyl ether acetate, and carbitol acetate; carbitols such as cellosolve and butyl carbitol; aromatic hydrocarbons such as toluene and xylene; and an amide-based solvent such as dimethylformamide, dimethylacetamide, and N-methylpyrrolidone. The organic solvent may be used in combination of two or more kinds thereof.

Although a drying condition is not particularly limited, it is performed so that the content of the organic solvent in the resin composition layer is 10% by mass or less, and preferably 5% by mass or less. The drying condition varies depending upon the content of the organic solvent in the varnish and the boiling point of the organic solvent. For example, the resin composition layer can be formed by drying the varnish containing 30 to 60% by mass of the organic solvent at 50 to 150° C. for about 3 to 10 minutes.

In the adhesive film, the thickness of the formed resin composition layer is preferably equal to or more than the thickness of the conductive layer. Since the thickness of the conductive layer in the circuit substrate is generally within a range of 5 to 70 μm, the resin composition layer preferably has a thickness of 10 to 100 μm.

Examples of the support may include various plastic films including a film of polyolefin such as polyethylene, polypropylene and polyvinyl chloride, a film of polyester such as polyethylene terephthalate (hereinafter may be abbreviated as "PET") and polyethylene naphthalate, a polycarbonate film, and a polyimide film. Further, a release paper, a metal foil such as a copper foil and an aluminum foil, and the like, can be used. The support and a protective film to be described later may be subjected to a surface treatment such as a mat treatment and a corona treatment. Alternatively, the support and the protective film may be subjected to a release treatment with a release agent such as a silicone resin-based release agent, an alkyd resin-based release agent, and a fluororesin-based release agent.

Although the thickness of the support is not particularly limited, it is preferably 10 to 150 μm, and more preferably 25 to 50 μm.

On the surface of the resin composition layer with which the support is not in contact, a protective film corresponding to the support can be further laminated. The thickness of the protective film is not particularly limited and is, for example, 1 to 40 μm. When the protective film is laminated, attachment of dusts or the like or generation of scratch on the surface of the resin composition layer can be prevented. The adhesive film can be wound in a roll form and stored.

Multilayered Printed Wiring Board Using Adhesive Film.

Next, an example of a method for manufacturing a multilayered printed wiring board using thus manufactured adhesive film will be described.

Firstly, the adhesive film is laminated on one surface or both surfaces of a circuit substrate using a vacuum laminator. Examples of the substrate used for the circuit substrate may include a glass epoxy substrate, a metal substrate, a polyester substrate, a polyimide substrate, a BT resin substrate, and a thermosetting polyphenylene ether substrate. The circuit substrate used herein refers to a substrate having a patterned conductive layer (circuit) formed on one surface or both surfaces thereof. Further, a multilayered printed wiring board that has alternately layered conductive and insulating layers, and that has a patterned conductive layer (circuit) on one surface or both surfaces of an outermost layer thereof, is also included in the circuit substrate used herein. The surface of the conductive layer may be previously subjected to a roughening treatment such as a blackening treatment and copper etching.

In the laminating, when the adhesive film has a protective film, the protective film is first removed, then the adhesive film and the circuit substrate are preheated, if desired, and the adhesive film is compression-bonded to the circuit substrate while pressing and heating. In the adhesive film of the present invention, there is suitably adopted a method in which the adhesive film is laminated on the circuit substrate under reduced pressure by a vacuum lamination method. Although a lamination condition is not particularly limited, it is preferable, for example, that the lamination is carried out under the following condition: a compression bonding temperature (lamination temperature) of preferably 70 to 140° C.; a compression bonding pressure of preferably 1 to 11 kgf/cm$^2$ ($9.8 \times 10^4$ to $107.9 \times 10^4$ N/m$^2$); and under a reduced pressure of 20 mmHg (26.7 hPa) or less in terms of a pneumatic pressure. The lamination method may be a method of batch mode or of continuous mode using rolls. The vacuum lamination can be performed using a commercially available vacuum laminator. Examples of the commercially available vacuum laminator may include a vacuum applicator manufactured by Nichigo-Morton Co., Ltd., a vacuum pressure laminator manufactured by Meiki Co., Ltd., a roll type dry coater manufactured by Hitachi Industries Co., Ltd., and a vacuum laminator manufactured by Hitachi AIC Inc.

The lamination step of performing heating and pressing under reduced pressure can be carried out using a general vacuum hot press machine. For example, the lamination step can be carried out by pressing a metal plate such as a heated SUS plate from a support layer side. As to a pressing condition, a degree of reduced pressure is usually $1 \times 10^{-2}$ MPa or less, and preferably $1 \times 10^{-3}$ MPa or less. Although the heating and pressing can be performed by one stage, it is preferable to perform the heating and pressing separately by two or more stages from the viewpoint of controlling bleeding of the resin. For example, it is preferable to perform the first-stage pressing at a temperature of 70 to 150° C. under a pressure of 1 to 15 kgf/cm² and the second-stage pressing at a temperature of 150 to 200° C. under a pressure of 1 to 40 kgf/cm². It is preferable that the pressing is performed at each stage for a period of 30 to 120 minutes. Examples of a commercially available vacuum hot pressing machine may include MNPC-V-750-5-200 (manufactured by Meiki Co., Ltd.) and VH1-1603 (manufactured by KITAGAWA SEIKI CO., LTD.).

The insulating layer can be formed on the circuit substrate by laminating the adhesive film on the circuit substrate, cooling the laminate to about room temperature, releasing the support in the case of releasing the support, and then thermally curing the resin composition layer. A condition for the thermal curing may be appropriately selected depending on the kind and content of each resin component in the resin composition. The condition for the thermal curing is preferably selected from a range at 150° C. to 220° C. for 20 minutes to 180 minutes, and more preferably from a range at 160° C. to 210° C. for 30 to 120 minutes.

After forming the insulating layer, the support is released at this time in the case where the support has not been released before curing. Thereafter, the insulating layer formed on the circuit substrate is perforated as necessary to form a via hole or a through-hole. The perforation can be performed, for example, by a known method using drill, laser, plasma, or the like, or can be performed through a combination of these methods, if necessary. The perforation using a laser such as a carbon dioxide gas laser and a YAG laser is the most common method.

Subsequently, the conductive layer is formed on the insulating layer by dry plating or wet plating. As the dry plating, there can be used a known method such as vapor deposition, sputtering, and ion plating. In the wet plating, the surface of the insulating layer is subjected to a swelling treatment with a swelling solution, a roughening treatment with an oxidant, and a neutralization treatment with a neutralization solution, in this order, to form convex-concave anchor. The swelling treatment with a swelling solution can be performed by immersing the insulating layer into the swelling solution at 50 to 80° C. for 5 to 20 minutes. Examples of the swelling solution may include an alkali solution and a surfactant solution. An alkali solution is preferable. Examples of the alkali solution may include a sodium hydroxide solution and a potassium hydroxide solution. Examples of a commercially available swelling solution may include Swelling Dip Securiganth P and Swelling Dip Securiganth SBU, available from Atotech Japan K. K. The roughening treatment with an oxidant can be performed by immersing the insulating layer into an oxidant solution at 60° C. to 80° C. for 10 minutes to 30 minutes. Examples of the oxidant may include an alkaline permanganate solution in which potassium permanganate or sodium permanganate is dissolved in an aqueous solution of sodium hydroxide, dichromate, ozone, hydrogen peroxide/sulfuric acid, and nitric acid. The concentration of permanganate in an alkaline permanganate solution is preferably 5 to 10% by weight. Examples of a commercially available oxidant may include an alkaline permanganate solution such as Concentrate Compact CP and Dosing Solution Securiganth P available from Atotech Japan K. K. The neutralization treatment with a neutralization solution can be performed by immersing the insulating layer into the neutralization solution at 30 to 50° C. for 3 to 10 minutes. The neutralization solution is preferably an acidic aqueous solution. Examples of a commercially available neutralization solution may include Reduction Solution Securiganth P available from Atotech Japan K. K.

Subsequently, the conductive layer is formed by combination of electroless plating and electrolytic plating. The conductive layer can also be formed by forming a plating resist with a reverse pattern of the conductive layer and performing only electroless plating. As a subsequent patterning method, there can be used a subtractive method or a semi-additive method which is known to those skilled in the art.

Prepreg.

The prepreg of the present invention can be manufactured by impregnating the resin composition of the present invention in a sheet-shaped reinforcing base material made of fiber using a hot melt method or a solvent method and then semi-curing the resultant by heating. That is, the prepreg can be formed so that the resin composition of the present invention is impregnated in a sheet-shaped reinforcing base material made of fiber. As the sheet-shaped reinforcing base material made of fiber, there can be used, for example, those made of fiber that is commonly used for a prepreg, such as a glass cloth and an aramid fiber.

The holt melt method is a method for manufacturing a prepreg by once applying a resin to a coated paper, which has good release properties against the resin, without dissolving the resin in an organic solvent and laminating it onto a sheet-shaped reinforcing base material, or by applying a resin directly to a sheet-shaped reinforcing base material using a die coater without dissolving the resin in an organic solvent. The solvent method is a method in which a resin is dissolved in an organic solvent to prepare a resin varnish similarly to the case of manufacturing the adhesive film, and a sheet-shaped reinforcing base material is immersed in this varnish, thereby impregnating the resin varnish in the sheet-shaped reinforcing base material, and then the resultant is dried.

Multilayered Printed Wiring Board Using Prepreg.

Next, an example of a method for manufacturing a multilayered printed wiring board using the prepreg thus manufactured will be described. One sheet or optionally a plurality of sheets of the prepreg of the present invention are stacked on the circuit substrate and sandwiched by metal plates via a release film, followed by vacuum press lamination under a pressing and heating condition. The pressing and heating condition is preferably under a pressure of 5 to 40 kgf/cm² (49×10⁴ to 392×10⁴ N/m²), at a temperature of 120 to 200° C., and for a period of 20 to 100 minutes. It is also possible to laminate the prepreg onto the circuit substrate by a vacuum lamination method and then to perform thermal curing similarly to the case of using the adhesive film. Thereafter, the multilayered printed wiring board can be manufactured by roughening a surface of the cured prepreg and then forming a conductive layer by plating in the same manner as described above.

Semiconductor Device.

A semiconductor device can be manufactured using the multilayered printed wiring board of the present invention. A semiconductor device can be manufactured by mounting a semiconductor chip on conducting parts of the multilayered printed wiring board of the present invention. The "conducting part" means a "part for conducting electric signals in the multilayered printed wiring board," which may be positioned on the surface or embedded parts therein. The semiconductor chip is not particularly limited as long as the chip is an electric circuit element made of a semiconductor material.

The method for mounting a semiconductor chip in manufacturing the semiconductor device of the present invention is not particularly limited as long as the semiconductor chip effectively functions. Specific examples thereof may include a wire bonding mounting method, a flip-chip mounting method, a mounting method using a bumpless build-up layer (BBUL), a mounting method using an anisotropic conductive film (ACF), and a mounting method using a non-conductive film (NCF).

The "mounting method using a bumpless build-up layer (BBUL)" means "a mounting method in which a semiconductor chip is directly embedded in a concave of a multilayered printed wiring board, followed by connecting the semiconductor chip to the wiring on the printed wiring board." Further, the mounting method is roughly classified into the following BBUL method 1) and BBUL method 2).

BBUL method 1): Method for mounting a semiconductor chip in a concave of a multilayered printed wiring board with an underfilling agent BBUL method 2): Method for mounting a semiconductor chip in a concave of a multilayered printed wiring board with an adhesive film or a prepreg The BBUL method 1) specifically includes the following steps:

Step 1) The conductive layers are removed from both sides of a multilayered printed wiring board, and through-holes are formed with a laser or a mechanical drill in the multilayered printed wiring board.

Step 2) An adhesive tape is stuck to one side of the multilayered printed wiring board, and the base of the semiconductor chip is disposed in the through-hole so that the semiconductor chip is fixed on the adhesive tape. At that time, it is preferable that the semiconductor chip is disposed at a position lower than the height of the through-hole.

Step 3) An underfilling agent is injected and loaded into a space between the through-hole and the semiconductor chip to fix the semiconductor chip in the through-hole.

Step 4) After that, the adhesive tape is peeled off to expose the base of the semiconductor chip.

Step 5) On the base side of the semiconductor chip, the adhesive film or prepreg of the present invention is laminated to cover the semiconductor chip.

Step 6) The adhesive film or prepreg is cured and then perforated by a laser to expose a bonding pad on the base of the semiconductor chip, followed by the roughening treatment, electroless plating and electrolytic plating as described above, to connect the wiring. If necessary, the adhesive film or prepreg may be further laminated.

The BBUL method 2) specifically includes the following steps:

Step 1) Photoresist films are formed on conductive layers on both sides of a multilayered printed wiring board, and apertures are formed only on one side of the photoresist films by a photolithography process.

Step 2) The conductive layer exposed in the apertures is removed using an etching solution to expose an insulating layer, and the resist films on both sides are then removed.

Step 3) All of the exposed insulting layers are removed and perforation is performed with a laser or drill to form concaves. It is preferable to use a laser in which the laser energy can be adjusted so that laser absorption in copper is decreased and laser absorption in the insulating layer is increased, and more preferable to use a carbon dioxide gas laser. The use of such a laser allows removing only the insulating layer without penetrating the conductive layer on the opposite side of the aperture of the conductive layer.

Step 4) The semiconductor chip is disposed at the concave so that the base of the semiconductor chip faces the aperture side, and the adhesive film or prepreg of the present invention is laminated from the aperture side to cover the semiconductor chip and embedded in a space between the semiconductor chip and the concave. It is preferable that the semiconductor chip is disposed at a position lower than the height of the concave.

Step 5) The adhesive film or prepreg is cured and then perforated with a laser to expose a bonding pad on the base of the semiconductor chip.

Step 6) The roughening treatment, non-electrolytic plating, and electrolytic plating as described above, are performed to connect the wiring, and if necessary, an adhesive film or prepreg may further be laminated.

Among the methods for mounting a semiconductor chip, from the viewpoints of downsizing of a semiconductor device and a reduction of transmission loss or from the viewpoints of no influence of thermal history on the semiconductor chip because of using no solder and no strain to be occurred in the future between the resin and the solder, the mounting method using a bumpless build-up layer (BBUL) is preferable, the BBUL methods 1) and 2) are more preferable, and the BBUL method 2) is still more preferable.

Other features of the invention will become apparent in the course of the following descriptions of exemplary embodiments which are given for illustration of the invention and are not intended to be limiting thereof.

EXAMPLES

Measurement Methods and Evaluation Methods

Various measurement methods and evaluation methods will be described first.
Preparation of Sample for Measuring Peel Strength, Arithmetic Mean Roughness (Ra Value), and Root Mean Square Roughness (Rq Value).
(1) Pretreatment of Internal Layer Circuit Substrate.

Both sides of a double-sided copper clad laminate with an epoxy resin-glass cloth base material in which an internal layer circuit was formed (thickness of copper foil: 18 μm, substrate thickness: 0.3 mm, R5715ES, manufactured by Matsushita Electric Works, Ltd.) were etched to a depth of 1 μm by CZ8100 available from Mec Co., Ltd., whereby the copper surface was subjected to a roughening treatment.
(2) Lamination of Adhesive Film.

Each of adhesive films prepared in Examples and Comparative Examples was laminated onto both sides of the internal layer circuit substrate using a batch-type vacuum pressure laminator MVLP-500 (trade name, manufactured by Meiki Co., Ltd.). The lamination was carried out by reducing the pressure for 30 seconds to an air pressure of 13 hPa or lower and then pressing for 30 seconds at 100° C. under a pressure of 0.74 MPa.
(3) Curing of Resin Composition.

In Examples 1 to 9, a PET film was released from the laminated adhesive film, and then the resin composition was cured under a curing condition at 100° C. for 30 minutes and subsequently at 180° C. for 30 minutes, thereby forming an insulating layer. In Example 10, a PET film was released after the resin composition was thermally cured under the same condition, thereby forming an insulating layer.
(4) Roughening Treatment.

The internal layer circuit substrate having an insulating layer formed thereon was immersed in a swelling liquid, diethylene glycol monobutyl ether-containing Swelling Dip Securiganth P (aqueous solution of glycol ethers and sodium hydroxide) available from Atotech Japan K. K., at 60° C. for 5 minutes in Examples 1 to 9 and at 60° C. for 10 minutes in Example 10; then immersed in a roughening solution, Concentrate Compact P (aqueous solution of 60 g/L of $KMnO_4$ and 40 g/L of NaOH) manufactured by Atotech Japan K. K., at 80° C. for 15 minutes in Examples 1 to 9 and at 80° C. for 20 minutes in Example 10; and finally immersed in a neutralization solution, Reduction Solution Securiganth P (aqueous solution of glyoxal and sulfuric acid) manufactured by Atotech Japan K. K., at 40° C. for 5 minutes. After drying at 80° C. for 30 minutes, the arithmetic mean roughness (Ra value) of the insulating layer surface after this roughening treatment was measured.

(5) Plating by Semi-Additive Method.

In order to form a circuit on the surface of the insulating layer, the internal layer circuit substrate was immersed in a $PdCl_2$-containing electroless plating solution at 40° C. for 5 minutes and then immersed in an electroless copper plating liquid at 25° C. for 20 minutes. After an annealing treatment by heating at 150° C. for 30 minutes, an etching resist was formed and patterned by etching, and electrolytic plating with copper sulfate was performed to form a conductive layer having a thickness of 35±5 μm. Subsequently, an annealing treatment was performed at 200° C. for 60 minutes. The resultant circuit substrate was measured for a peeling strength (peel strength) of the plated conductive layer.

Measurement of Peeling Strength (Peel Strength) of Plated Conductive Layer.

A cut was made in a portion of 10 mm in width and 100 mm in length of the conductive layer of the circuit substrate, one end thereof was peeled and grasped by a grasping tool (AUTOCOM type testing instrument, AC-50C-SL, manufactured by TSE Co., Ltd.), and a load (kgf/cm) at the time of peeling to an extent of 35 mm in a vertical direction at a rate of 50 mm/min at room temperature was measured.

Measurement of Arithmetic Mean Roughness (Ra Value) and Root Mean Square Roughness (Rq Value) After Roughening.

An Ra value and an Rq value were determined from numerical values obtained in a measurement region of 121 μm×92 μm using a non-contact type surface roughness meter (WYKO NT3300 manufactured by Veeco Instruments Inc.) in a VSI contact mode with a 50-times lens. Measurement was performed by determining an average value at 10 points.

Measurement of Average Thermal Expansion Coefficient and Glass Transition Temperature.

Each of the adhesive films obtained in Examples and Comparative Examples was heat cured by heating at 200° C. for 90 minutes, and the PET film was released to obtain a sheet-shaped cured product. The cured product was cut into a specimen of about 5 mm in width and about 15 mm in length and subjected to thermomechanical analysis by the tensile load method using a thermomechanical analyzer Thermo Plus TMA8310 (manufactured by Rigaku Corporation). The specimen was installed in the analyzer, and continuously measured twice under a measurement condition at a load of 1 g at a temperature elevation rate of 5° C./min. In the second measurement, an average coefficient of thermal expansion (ppm) at 25° C. to 150° C. was calculated. In the second measurement, a glass transition temperature (° C.) was calculated from a point in which the inclination of dimensional change signal was changed.

Calculation of Carbon Amount Per Unit Surface Area.

3 g of each product obtained in Production Example was used as each sample. The sample and 30 g of methyl ethyl ketone (MEK) were placed in a centrifuge tube of a centrifugal separator, stirred to suspend a solid content, and irradiated with an ultrasonic wave of 500 W for 5 minutes. Then, solid-liquid separation was performed by centrifugation, and a supernatant liquid was removed. Further, 30 g of MEK was added thereto. The resultant mixture was stirred to suspend a solid content, and irradiated with an ultrasonic wave of 500 W for 5 minutes. After then, solid-liquid separation was performed by centrifugation, and a supernatant liquid was removed. The solid content was dried at 150° C. for 30 minutes. 0.3 g of the dried sample was accurately weighed in a crucible for measurement, and a combustion improver (3.0 g of tungsten and 0.3 g of tin) was placed in the crucible for measurement. The crucible for measurement was set to a carbon analyzer ("EMIA-320V" manufactured by Horiba, Ltd.) and a carbon amount was measured. The measured carbon amount was divided by the specific surface area of the inorganic filler used, thus calculating a carbon amount per unit surface area.

Production Example 1

100 parts by mass of spherical silica ("SOC2" available from Admatechs Company Limited, average particle diameter: 0.5 μm) was placed in a Henschel type powder blender, and stirred for 10 minutes while spraying 0.6 parts by mass of an epoxy group-containing alkoxysilyl resin ("X-41-1056" available from Shin-Etsu Chemical Co., Ltd., glycidoxypropyl group-containing methoxysilyl resin, viscosity: 40 mm$^2$/s). The spherical silica was further stirred at 75° C. for 1 hour, and a volatile component was distilled off to produce a product 1 (carbon amount per unit surface area: 0.30 mg/m$^2$).

Production Example 2

100 parts by mass of spherical silica (SOC2" available from Admatechs Company Limited, average particle diameter: 0.5 μm) was placed in a Henschel type powder blender, and stirred for 10 minutes while spraying 0.6 parts by mass of a mercapto group-containing alkoxysilyl resin ("X-41-1805" available from Shin-Etsu Chemical Co., Ltd., mercaptopropyl group-containing methoxysilyl resin and mercaptopropyl group-containing ethoxysilyl resin, viscosity: 30 mm$^2$/s). The spherical silica was further stirred at 75° C. for 1 hour, and a volatile component was distilled off to produce a product 2 (carbon amount per unit surface area: 0.25 mg/m$^2$).

Production Example 3

100 parts by mass of spherical silica ("SOC2" available from Admatechs Company Limited, average particle diameter: 0.5 μm) was placed in a Henschel type powder blender, and stirred for 10 minutes while spraying 0.6 parts by mass of an amino group-containing alkoxysilyl resin ("X-40-2651" available from Shin-Etsu Chemical Co., Ltd., 3-aminopropyl group-containing ethoxysilyl resin, viscosity: 20 mm$^2$/s). The spherical silica was further stirred at 75° C. for 1 hour, and a volatile component was distilled off to produce a product 3 (carbon amount per unit surface area: 0.18 mg/m$^2$).

Production Example 4

100 parts by mass of spherical silica ("SOC2" available from Admatechs Company Limited, average particle diameter: 0.5 μm) was placed in a Henschel type powder blender, and stirred for 10 minutes while spraying 0.6 parts by mass of an N-phenyl-3-aminopropyl group-containing methoxysilyl resin (obtained by a reaction of partially hydrolyzing the alkoxy groups of "KBM573" available from Shin-Etsu Chemical Co., Ltd., and methyl trimethoxysilane, and polycondensing them, viscosity: 234 mm$^2$/s). The spherical silica was further stirred at 75° C. for 1 hour, and a volatile component was distilled off to produce a product 4 (carbon amount per unit surface area: 0.16 mg/m$^2$).

Production Example 5

100 parts by mass of spherical silica ("SOC2" available from Admatechs Company Limited, average particle diameter: 0.5 µm) was placed in a Henschel type powder blender, and stirred for 10 minutes while spraying 0.6 parts by mass of an N-phenyl-3-aminopropyl group-containing methoxysilyl resin (obtained by a reaction of partially hydrolyzing the alkoxy groups of "KBM573" available from Shin-Etsu Chemical Co., Ltd., and polycondensing them, viscosity: 1,045 mm$^2$/s). The spherical silica was further stirred at 75° C. for 1 hour, and a volatile component was distilled off to produce a product 5 (carbon amount per unit surface area: 0.20 mg/m$^2$).

Production Example 6

100 parts by mass of spherical silica ("SOC2" available from Admatechs Company Limited, average particle diameter: 0.5 µm) was placed in a Henschel type powder blender, and stirred for 10 minutes while spraying 0.6 parts by mass of an N-phenyl-3-aminopropyl group-containing methoxysilyl resin (obtained by a reaction of partially hydrolyzing the alkoxy groups of "KBM573" available from Shin-Etsu Chemical Co., Ltd., and methyl trimethoxysilane, and polycondensing them, viscosity: 1,392 mm$^2$/s). The spherical silica was further stirred at 75° C. for 1 hour, and a volatile component was distilled off to produce a product 6 (carbon amount per unit surface area: 0.15 mg/m$^2$).

Production Example 7

100 parts by mass of spherical silica ("SOC2") available from Admatechs Company Limited, average particle diameter: 0.5 µm) was placed in a Henschel type powder blender, and stirred for 10 minutes while spraying 0.6 parts by mass of an epoxy group-containing silane coupling agent ("KBM403" available from Shin-Etsu Chemical Co., Ltd.). The spherical silica was further stirred at 75° C. for 1 hour, and a volatile component was distilled off to produce a product 7 (carbon amount per unit surface area: 0.22 mg/m$^2$).

Production Example 8

100 parts by mass of spherical silica ("SOC2" available from Admatechs Company Limited, average particle diameter: 0.5 µm) was placed in a Henschel type powder blender, and stirred for 10 minutes while spraying 0.6 parts by mass of a mercapto group-containing silane coupling agent ("KBM803" available from Shin-Etsu Chemical Co., Ltd.). The spherical silica was further stirred at 75° C. for 1 hour, and a volatile component was distilled off to produce a product 8 (carbon amount per unit surface area: 0.17 mg/m$^2$).

Production Example 9

100 parts by mass of spherical silica ("SOC2" available from Admatechs Company Limited, average particle diameter: 0.5 µm) was placed in a Henschel type powder blender, and stirred for 10 minutes while spraying 0.6 parts by mass of an amino group-containing silane coupling agent ("KBE903" available from Shin-Etsu Chemical Co., Ltd.). The spherical silica was further stirred at 75° C. for 1 hour, and a volatile component was distilled off to produce a product 9 (carbon amount per unit surface area: 0.12 mg/m$^2$).

Production Example 10

100 parts by mass of spherical silica ("SOC2" available from Admatechs Company Limited, average particle diameter: 0.5 µm) was placed in a Henschel type powder blender, and stirred for 10 minutes while spraying 0.6 parts by mass of a reactive silicone oil ("KF-857" available from Shin-Etsu Chemical Co., Ltd., a substance having, instead of an alkoxy group, an alkyl group bonded thereto, viscosity: 65 mm$^2$/s). The spherical silica was further stirred at 75° C. for 1 hour, and a volatile component was distilled off to produce a product 10 (carbon amount per unit surface area: 0.26 mg/m$^2$)

Example 1

Five parts by mass of a naphthalene type epoxy resin (epoxy equivalent weight: 144, "HP4700" available from DIC Corporation), 14 parts by mass of a liquid bisphenol A type epoxy resin (epoxy equivalent weight: 180, "jER828EL" available from Mitsubishi Chemical Corporation), and 14 parts by mass of a biphenyl type epoxy resin (epoxy equivalent weight: 269, "NC3000H" available from by NIPPON KAYAKU Co., Ltd.) were dissolved by heating in 30 parts by mass of solvent naphtha with stirring, and then cooled to room temperature to prepare a mixture 1. Subsequently, 1.5 parts by mass of rubber particles (Staphyloid AC3816N available from Ganz Chemical Co., Ltd.) were placed in 6 parts by mass of solvent naphtha and allowed to swell at 20° C. for 12 hours to produce a mixture 2. Into the mixture 1, the mixture 2, 100 parts by mass of spherical silica ("SOC2" available from Admatechs Company Limited, average particle diameter: 0.5 µm), and 0.6 parts by mass of an epoxy group-containing alkoxysilyl resin ("X-41-1056" available from Shin-Etsu Chemical Co., Ltd., epoxy equivalent weight: 280) were added as they were. Further, 5 parts by mass of a flame retardant ("HCA-HQ" available from SANKO CO., LTD., 10-(2,5-dihydroxyphenyl)-10-hydro-9-oxa-10-phosphaphenanthrene-10-oxide, average particle diameter: 1 µm) was added thereto, and the mixture was kneaded and dispersed by a triple roll mill. To the mixture, 10 parts by mass of a phenol novolac-based curing agent ("LA-7054" available from DIC Corporation, methyl ethyl ketone (hereinafter abbreviated as "MEK") solution of 60% by mass of non-volatile component with a phenolic hydroxyl group equivalent weight of 124), 10 parts by mass of a naphthalene-based phenol resin (phenolic hydroxyl group equivalent weight: 215, "SN485" available from Nippon Steel Chemical Co., Ltd., MEK solution of 60% by mass of non-volatile component), 7 parts by mass of a phenoxy resin (weight average molecular weight: 35,000, "YL7553" available from Mitsubishi Chemical Corporation, solution of 30% by mass of non-volatile component in 1:1 mixture of MEK and cyclohexanone), 2 parts by mass of 5% by mass solution of 4-dimethyl aminopyridine in MEK as an accelerator, and 4 parts by mass of methyl ethyl ketone (MEK) were mixed, and uniformly dispersed by a rotary mixer to prepare a resin varnish. Subsequently, the resin varnish was uniformly applied to a release face of a polyethylene terephthalate film treated by an alkyd-based releasing agent (thickness: 38 µm) using a die coater so that the thickness of dried resin composition layer was 40 µm, and dried at from 80 to 110° C. (95° C. in average) for 5 minutes (residual solvent amount in the resin composition layer: about 2% by mass). Then, the resin composition layer was wound into a roll form while a polypropylene film having a thickness of 15 μm was attached to the surface of the resin composition layer. The adhesive film in a roll form was slit to have a width of 507 mm, thereby obtaining a sheet-shaped adhesive film having a size of 507×336 mm.

Example 2

A resin varnish was prepared in exactly the same manner as in Example 1, except that 0.6 parts by mass of the epoxy group-containing alkoxysilyl resin ("X-41-1056" available from Shin-Etsu Chemical Co., Ltd.) was changed into 0.6 parts by mass of a mercapto group-containing alkoxysilyl resin ("X-41-1805" available from Shin-Etsu Chemical Co., Ltd., mercapto equivalent weight: 800). Subsequently, an adhesive film was obtained using the resin varnish in exactly the same manner as in Example 1.

Example 3

A resin varnish was prepared in exactly the same manner as in Example, 1, except that 0.6 parts by mass of the epoxy group-containing alkoxysilyl resin ("X-41-1056" available from Shin-Etsu Chemical Co., Ltd.) was changed into 0.6 parts by mass of an amino group-containing alkoxysilyl resin ("X-40-2651" available from Shin-Etsu Chemical Co., Ltd.). Subsequently, an adhesive film was obtained using the resin varnish in exactly the same manner as in Example 1.

Example 4

A resin varnish was prepared in exactly the same manner as in Example 1, except that the product of Production Example 1 was added instead of adding 100 parts by mass of the spherical silica ("SCO2" available from Admatechs Company Limited, average particle diameter: 0.5 μm) and 0.6 parts by mass of the epoxy group-containing methoxysilyl resin ("X-41-1056" available from Shin-Etsu Chemical Co., Ltd.) as they were. Subsequently, an adhesive film was obtained using the resin varnish in exactly the same manner as in Example 1.

Example 5

A resin varnish was prepared in exactly the same manner as in Example 1, except that the product of Production Example 2 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Example 6

A resin varnish was prepared in exactly the same manner as in Example 1, except that the product of Production Example 3 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Example 7

A resin varnish was prepared in exactly the same manner as in Example 1, except that the product of Production Example 4 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Example 8

A resin varnish was prepared in exactly the same manner as in Example 1, except that the product of Production Example 5 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Example 9

A resin varnish was prepared in exactly the same manner as in Example 1, except that the product of Production Example 6 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Example 10

Eight parts by mass of a naphthalene type epoxy resin (epoxy equivalent weight: 144, "EXA4032SS" available from DIC Corporation), 11 parts by mass of a bixylenol type epoxy resin (epoxy equivalent weight: 190, "YX4000HK" available from Mitsubishi Chemical Corporation), and 9 parts by mass of a modified naphthalene type epoxy resin (epoxy equivalent weight: 330, "ESN475V" available from by Nippon Steel Chemical Co., Ltd.) were dissolved by heating in 32 parts by mass of solvent naphtha with stirring, and then cooled to room temperature. In the mixed solution, a mixture in which 1.5 parts by mass of staphyloid (AC3816N available from Ganz Chemical Co., Ltd.) as a rubber particle was placed in 6 parts by mass of solvent naphtha and allowed to swell at 20° C. for 12 hours, 140 parts by mass of spherical silica ("SOC2" available from Admatechs Company Limited, average particle diameter: 0.5 μm), and 0.7 parts by mass of an amino group-containing alkoxysilyl resin ("X-40-2651" available from Shin-Etsu Chemical Co., Ltd.) were mixed, and then kneaded and uniformly dispersed by a triple roll mill. To the mixture, 45 parts by mass of an active ester curing agent ("HPC-8000-65T" available from DIC Corporation, a toluene solution of 65% by mass of non-volatile component with an active group equivalent weight of about 223), 5 parts by mass of a phenoxy resin (weight average molecular weight: 35,000, "YL7553" available from Mitsubishi Chemical Corporation, solution of 30% by mass of non-volatile component in 1:1 mixture of MEK and cyclohexanone), 3 parts by mass of 10% by mass solution of 1-benzyl-2-phenylimidazole in MEK as an accelerator, and 7 pars by mass of methyl ethyl ketone (MEK) were mixed, and uniformly dispersed by a rotary mixer, to prepare a resin varnish. Subsequently, an adhesive film was obtained using the resin varnish in exactly the same manner as in Example 1.

Comparative Example 1

A resin varnish was prepared in exactly the same manner as in Example 1, except that an epoxy group-containing alkoxysilyl resin ("X-41-1056" available from Shin-Etsu Chemical Co., Ltd.) was not added. Subsequently, an adhesive film was obtained using the resin varnish in exactly the same manner as in Example 1.

Comparative Example 2

A resin varnish was prepared in exactly the same manner as in Example 1, except that 0.6 parts by mass of the epoxy group-containing alkoxysilyl resin ("X-41-1056" available from Shin-Etsu Chemical Co., Ltd.) was changed into 0.6 parts by mass of an epoxy group-containing silane coupling agent ("KBM403" available from Shin-Etsu Chemical Co., Ltd.). Subsequently, an adhesive film was obtained using the resin varnish in exactly the same manner as in Example 1.

Comparative Example 3

A resin varnish was prepared in exactly the same manner as in Example 1, except that 0.6 parts by mass of the epoxy group-containing alkoxysilyl resin ("X-41-1056" available from Shin-Etsu Chemical Co., Ltd.) was changed into 0.6 parts by mass of an epoxy group-containing silane coupling agent ("KBM803" available from Shin-Etsu Chemical Co., Ltd.). Subsequently, an adhesive film was obtained using the resin varnish in exactly the same manner as in Example 1.

Comparative Example 4

A resin varnish was prepared in exactly the same manner as in Example 1, except that 0.6 parts by mass of the epoxy group-containing alkoxysilyl resin ("X-41-1056" available from Shin-Etsu Chemical Co., Ltd.) was changed into 0.6 parts by mass of an amino group-containing silane coupling agent ("KBM903" available from Shin-Etsu Chemical Co., Ltd.). Subsequently, an adhesive film was obtained using the resin varnish in exactly the same manner as in Example 1.

Comparative Example 5

A resin varnish was prepared in exactly the same manner as in Example 1, except that the product of Production Example 7 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Comparative Example 6

A resin varnish was prepared in exactly the same manner as in Example 1, except that the product of Production Example 8 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Comparative Example 7

A resin varnish was prepared in exactly the same manner as in Example 1, except that the product of Production Example 9 was added instead of adding 100 parts by mass of the spherical silica ("SCO2" available from Admatechs Company Limited, average particle diameter: 0.5 μm) and 0.6 parts by mass of the epoxy group-containing alkoxysilyl resin ("X-41-1056" available from Shin-Etsu Chemical Co., Ltd.) as they were. Subsequently, an adhesive film was obtained using the resin varnish in exactly the same manner as in Example 1.

Comparative Example 8

A resin varnish was prepared in exactly the same manner as in Example 1 except that the product of Production Example 10 was added instead of adding 100 parts by mass of the spherical silica ("SCO2" vailable from Admatechs Company Limited, average particle diameter: 0.5 μm) and 0.6 parts by mass of the epoxy group-containing methoxysilyl resin ("X-41-1056" available from Shin-Etsu Chemical Co., Ltd.) as they were. Subsequently, an adhesive film was obtained using the resin varnish in exactly the same manner as in Example 1.

The results in Examples 1 to 3 and 10, and Comparative Examples 1 to 4 are shown in Table 1. The results in Examples 4 to 9 and Comparative Examples 5 to 8 are shown in Table 2.

TABLE 1

| | | | | Example | | | | Comparative Example | | | |
|---|---|---|---|---|---|---|---|---|---|---|---|
| | | | | 1 | 2 | 3 | 10 | 1 | 2 | 3 | 4 |
| Resin compo- sition | Blending components (parts by mass*) | (A) Epoxy resin | NC3000H | 14 | 14 | 14 | | 14 | 14 | 14 | 14 |
| | | | HP4700 | 5 | 5 | 5 | | 5 | 5 | 5 | 5 |
| | | | jER828EL | 14 | 14 | 14 | | 14 | 14 | 14 | 14 |
| | | | ESN475V | | | | 9 | | | | |
| | | | YX4000HK | | | | 11 | | | | |
| | | | EXA4032SS | | | | 8 | | | | |
| | | (B) Alkoxy oligomer | X-41-1056 | 0.6 | | | | | | | |
| | | | X-41-1805 | | 0.6 | | | | | | |
| | | | X-40-2651 | | | 0.6 | 0.7 | | | | |

TABLE 1-continued

|  |  |  | Example | | | | Comparative Example | | | |
|---|---|---|---|---|---|---|---|---|---|---|
|  |  |  | 1 | 2 | 3 | 10 | 1 | 2 | 3 | 4 |
|  | (B)' Silane coupling agent*¹ | KBM-403 |  |  |  |  | 0.6 |  |  |  |
|  |  | KBM-803 |  |  |  |  |  | 0.6 |  |  |
|  |  | KBM-903 |  |  |  |  |  |  | 0.6 | 0.6 |
|  | (C) Inorganic filler | SOC2 | 100 | 100 | 100 | 140 | 100 | 100 | 100 | 100 |
|  | (D) Accelerator | DMAP | 0.1 | 0.1 | 0.1 |  | 0.1 | 0.1 | 0.1 | 0.1 |
|  |  | 1B2PZ |  |  |  | 0.3 |  |  |  |  |
|  | (E) Curing agent | LA7054 | 6 | 6 | 6 |  | 6 | 6 | 6 | 6 |
|  |  | SN485 | 6 | 6 | 6 |  | 6 | 6 | 6 | 6 |
|  |  | HPC8000-65T |  |  |  | 29.25 |  |  |  |  |
|  | (F) Thermoplastic resin | YL7553 | 2.1 | 2.1 | 2.1 | 1.5 | 2.1 | 2.1 | 2.1 | 2.1 |
|  | (G) Rubber particle | AC3816N | 1.5 | 1.5 | 1.5 | 1.5 | 1.5 | 1.5 | 1.5 | 1.5 |
|  | (H) Flame retardant | HCA-HQ | 5 | 5 | 5 |  | 5 | 5 | 5 | 5 |
| Silica content (% by mass) |  |  | 64.8 | 64.8 | 64.8 | 69.6 | 65.1 | 64.8 | 64.8 | 64.8 |
| Result of evaluation | Glass transition temperature (° C.) |  | 153 | 158 | 157 | 149 | 154 | 154 | 159 | 157 |
|  | Thermal expansion coefficient (ppm) |  | 26 | 24 | 26 | 23 | 25 | 25 | 25 | 24 |
|  | Peel strength (kgf/cm) |  | 0.53 | 0.52 | 0.53 | 0.50 | 0.32 | 0 | 0 | 0 |
|  | Arithmetic mean roughness Ra (nm) |  | 235 | 281 | 172 | 50 | 350 | 520 | 552 | 545 |
|  | Root mean square roughness Rq (nm) |  | 352 | 412 | 313 | 65 | 522 | 765 | 812 | 723 |

*In terms of non-volatile component
*¹Comparative component of "(B) Alkoxy oligomer"

TABLE 2

|  |  |  |  | Example | | | | | | Comparative Example | | | |
|---|---|---|---|---|---|---|---|---|---|---|---|---|---|
|  |  |  |  | 4 | 5 | 6 | 7 | 8 | 9 | 5 | 6 | 7 | 8 |
| Resin composition | Blending components (parts by mass*) | (A) Epoxy resin | NC3000H | 14 | 14 | 14 | 14 | 14 | 14 | 14 | 14 | 14 | 14 |
|  |  |  | HP4700 | 5 | 5 | 5 | 5 | 5 | 5 | 5 | 5 | 5 | 5 |
|  |  |  | jER828EL | 14 | 14 | 14 | 14 | 14 | 14 | 14 | 14 | 14 | 14 |
|  |  |  | ESN475V |  |  |  |  |  |  |  |  |  |  |
|  |  |  | YX4000HK |  |  |  |  |  |  |  |  |  |  |
|  |  |  | EXA4032SS |  |  |  |  |  |  |  |  |  |  |
|  |  | Reaction product of (B) alkoxy oligomer and (C) inorganic filler | Product 1 | 100.6 |  |  |  |  |  |  |  |  |  |
|  |  |  | Product 2 |  | 100.6 |  |  |  |  |  |  |  |  |
|  |  |  | Product 3 |  |  | 100.6 |  |  |  |  |  |  |  |
|  |  |  | Product 4 |  |  |  | 100.6 |  |  |  |  |  |  |
|  |  |  | Product 5 |  |  |  |  | 100.6 |  |  |  |  |  |
|  |  |  | Product 6 |  |  |  |  |  | 100.6 |  |  |  |  |
|  |  | Reaction product of (B)' silane coupling agent and (C) inorganic filler*¹ | Product 7 |  |  |  |  |  |  | 100.6 |  |  |  |
|  |  |  | Product 8 |  |  |  |  |  |  |  | 100.6 |  |  |
|  |  |  | Product 9 |  |  |  |  |  |  |  |  | 100.6 |  |
|  |  |  | Product 10 |  |  |  |  |  |  |  |  |  | 100.6 |
|  |  | (D) Accelerator | DMAP | 0.1 | 0.1 | 0.1 | 0.1 | 0.1 | 0.1 | 0.1 | 0.1 | 0.1 | 0.1 |
|  |  |  | 1B2PZ |  |  |  |  |  |  |  |  |  |  |
|  |  | (E) Curing agent | LA7054 | 6 | 6 | 6 | 6 | 6 | 6 | 6 | 6 | 6 | 6 |
|  |  |  | SN485 | 6 | 6 | 6 | 6 | 6 | 6 | 6 | 6 | 6 | 6 |
|  |  |  | HPC8000-65T |  |  |  |  |  |  |  |  |  |  |
|  |  | (F) Thermoplastic resin | YL7553 | 2.1 | 2.1 | 2.1 | 2.1 | 2.1 | 2.1 | 2.1 | 2.1 | 2.1 | 2.1 |
|  |  | (G) Rubber particle | AC3816N | 1.5 | 1.5 | 1.5 | 1.5 | 1.5 | 1.5 | 1.5 | 1.5 | 1.5 | 1.5 |
|  |  | (H) Flame retardant | HCA-HQ | 5 | 5 | 5 | 5 | 5 | 5 | 5 | 5 | 5 | 5 |
| Silica content (% by mass) |  |  |  | 65.2 | 65.2 | 65.2 | 65.2 | 65.2 | 65.2 | 65.2 | 65.2 | 65.2 | 65.2 |
| Result of evaluation | Glass transition temperature (° C.) |  |  | 155 | 160 | 159 | 156 | 155 | 156 | 156 | 161 | 158 | 154 |
|  | Thermal expansion coefficient (ppm) |  |  | 25 | 23 | 23 | 24 | 24 | 23 | 24 | 24 | 24 | 26 |
|  | Peel strength (kgf/cm) |  |  | 0.56 | 0.52 | 0.54 | 0.55 | 0.54 | 0.55 | 0.1 | 0.15 | 0 | 0 |
|  | Arithmetic mean roughness Ra (nm) |  |  | 220 | 262 | 165 | 104 | 101 | 108 | 480 | 535 | 562 | 612 |
|  | Root mean square roughness Rq (nm) |  |  | 336 | 390 | 295 | 141 | 139 | 177 | 612 | 788 | 743 | 937 |

*In terms of non-volatile component
*¹Comparative component of "Reaction product of (B) alkoxy oligomer and (C) inorganic filler"

As seen from the results in Tables 1 and 2, the resin compositions in Examples 1 to 10 achieve a sufficient peel strength while obtaining low arithmetic mean roughness and low root mean square roughness. Since the Rq value reflects a local state of the surface of the insulating layer, it can be confirmed from a decrease in the Rq value that the insulating layer has a dense roughened surface. On the other hand, the resin compositions in Comparative Examples 1 to 8 result in high arithmetic mean roughness and high root mean square roughness, and result in significantly low peel strength due to expansion of the plating.

INDUSTRIAL APPLICABILITY

There can be provided a resin composition which can form an insulating layer that has a surface with not only low arithmetic mean roughness but also low root mean square roughness in a wet roughening step and that is capable of forming thereon a plated conductive layer having a sufficient peel strength while maintaining the glass transition temperature and thermal expansion coefficient. There can be also provided an adhesive film, a prepreg, a multilayered printed wiring board and a semiconductor device each using the resin composition, and further can be provided an electrical product such as a computer, a cellular phone, a digital camera and a television, and a vehicle such as a motorcycle, an automobile, a train, a ship and an airplane, on which they are mounted.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A resin composition, comprising:
   (A) at least one epoxy resin;
   (B) at least one alkoxy oligomer; and
   (C) at least one inorganic filler,
   wherein:
   said at least one alkoxy oligomer (B) is one or more selected from the group consisting of a glycidoxyalkyl group-containing alkoxysilyl resin, an aminoalkyl group-containing alkoxysilyl resin, and a mercaptoalkyl group-containing alkoxysilyl resin;
   an average particle diameter of said at least one inorganic filler (C) is 0.01 μm or more and 3 μm or less,
   a content of said at least one alkoxy oligomer (B) is 0.1 to 5% by mass when a content of said at least one inorganic filler (C) is defined as 100% by mass, and
   the resin composition is suitable for an insulating layer of a multilayered printed wiring board on which a conductive layer is formed by plating.

2. A resin composition according to claim 1, wherein at least part of said at least one alkoxy oligomer (B) is reacted with said at least one inorganic filler (C) to form a reaction product.

3. A resin composition according to claim 2, which is formed by reacting said at least one alkoxy oligomer (B) and said at least one inorganic filler (C) in advance and then adding the resultant product to said at least one epoxy resin (A).

4. A resin composition according to claim 3, formed by reacting said at least one alkoxy oligomer (B) and said at least one inorganic filler (C) at a temperature of 50 to 150° C. for a time of 0.5 to 3 hours in advance and adding the resultant product to said at least one epoxy resin (A).

5. A resin composition according to claim 2, wherein a carbon amount per unit surface area of said at least one inorganic filler (C) is 0.05 mg/m² or more.

6. A resin composition according to claim 5, wherein a value of [the amount (mg) of carbon atom in said at least one alkoxy oligomer (B) reacted with said at least one inorganic filler (C)/surface area (m²) of said at least one inorganic filler (C)] is 0.05 mg/m² or more.

7. A resin composition according to claim 1, wherein said at least one alkoxy oligomer (B) has a viscosity (25° C.) of 10 mm²/s to 2,000 mm²/s.

8. A resin composition according to claim 1, wherein said at least one alkoxy oligomer (B) is one or more selected from the group consisting of a glycidoxypropyl group-containing alkoxysilyl resin, an aminopropyl group-containing alkoxysilyl resin, an N-2-(aminoethyl)-3-aminopropyl group-containing alkoxysilyl resin, an N-phenyl-3-aminopropyl group-containing alkoxysilyl resin, and a mercaptopropyl group-containing alkoxysilyl resin.

9. A resin composition according to claim 1, wherein said at least one alkoxy oligomer (B) is one or more selected from the group consisting of a glycidoxypropyl group-containing methoxysilyl resin, an aminopropyl group-containing methoxysilyl resin, an aminopropyl group-containing ethoxysilyl resin, an N-2-(aminoethyl)-3-aminopropyl group-containing methoxysilyl resin, an N-phenyl-3-aminopropyl group-containing methoxysilyl resin, and a mercaptopropyl group-containing methoxysilyl resin.

10. A resin composition according to claim 1, wherein said at least one alkoxy oligomer (B) is represented by formula (1):

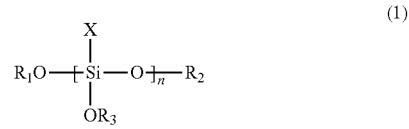

wherein:
R₁, R₂, and R₃ are each independently a linear or branched alkyl group having 1 to 10 carbon atoms;
X is a glycidoxyalkyl group, an aminoalkyl group, or a mercaptoalkyl group
n is an integer of 2 to 10;
a plurality of X may be the same as or different from each other; and
a plurality of R₃ may be the same as or different from each other.

11. A resin composition according to claim 1, further comprising (D) an accelerator.

12. A resin composition according to claim 1, further comprising (E) a curing agent.

13. A resin composition according to claim 1, further comprising (F) a thermoplastic resin.

14. A resin composition according to claim 1, further comprising (G) a rubber particle.

15. A resin composition according to claim 1, further comprising (H) a flame retardant.

16. A resin composition according to claim 1, wherein:
after curing said resin composition to form an insulating layer, roughening a surface of said insulating layer, and plating the surface of said insulating layer to form a conductive layer, a peel strength between the insulating layer and the conductive layer is 0.4 kgf/cm to 1.0 kgf/cm;
after curing said resin composition to form an insulating layer and roughening a surface of said insulating layer, the surface of the insulating layer after roughening has an arithmetic mean roughness of 10 nm to 300 nm and a root mean square roughness of 10 to 520 nm; and
the roughening is carried out by immersing the surface of said insulating layer into a swelling solution at 50 to 80° C. for 5 to 20 minutes, an oxidant at 60 to 80° C. for 10 to 30 minutes, and a neutralization solution at 30 to 50° C. for 3 to 10 minutes, in this order.

17. An adhesive film, comprising a layer of a resin composition according to claim 1 formed on a support.

18. A prepreg, comprising a resin composition according to claim 1 impregnated in a sheet-shaped reinforcing base material.

19. A multilayered printed wiring board, comprising:
an insulating layer which is formed of a cured product of a resin composition according to claim 1; and
a conductive layer formed by plating.

20. A semiconductor device, comprising a multilayered printed wiring board according to claim 19.

21. A resin composition according to claim 1, wherein a content of said at least one inorganic filler (C) is 20 to 85% by mass when a content of nonvolatile components in the resin composition is defined as 100% by mass.

22. A resin composition according to claim 1, wherein a weight average molecular weight of said at least one alkoxy oligomer (B) is 350 to 10,000.

23. A method of manufacturing a multilayered printed wiring board, the method comprising:
curing a resin composition to form an insulating layer, wherein the resin composition comprises (A) at least one epoxy resin, (B) at least one alkoxy oligomer, and (C) at least one inorganic filler, said at least one alkoxy oligomer (B) is one or more selected from the group consisting of a glycidoxyalkyl group-containing alkoxysilyl resin, an aminoalkyl group-containing alkoxysilyl resin, and a mercaptoalkyl group-containing alkoxysilyl resin, an average particle diameter of said at least one inorganic filler (C) is 0.01 µm or more and 3 µm or less, and a content of said at least one alkoxy oligomer (B) is 0.1 to 5% by mass when a content of said at least one inorganic filler (C) is defined as 100% by mass; and
plating a surface of said insulating layer to form a conductive layer.

* * * * *